US012753510B2

(12) United States Patent
Mane et al.

(10) Patent No.: US 12,753,510 B2
(45) Date of Patent: Oct. 6, 2026

(54) CALORIMETRY METHOD TO MEASURE CHEMICAL REACTION HEAT IN ALD/ALE PROCESSES USING TEMPERATURE-SENSITIVE RESISTANCE COATINGS

(71) Applicant: UCHICAGO ARGONNE, LLC, Chicago, IL (US)

(72) Inventors: Anil U. Mane, Naperville, IL (US); Jeffrey W. Elam, Elmhurst, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 706 days.

(21) Appl. No.: 17/956,665

(22) Filed: Sep. 29, 2022

(65) Prior Publication Data

US 2024/0110285 A1 Apr. 4, 2024

(51) Int. Cl.

| | |
|---|---|
| ***C23C 16/52*** | (2006.01) |
| ***C23C 16/44*** | (2006.01) |
| ***C23C 16/455*** | (2006.01) |
| ***G01K 17/08*** | (2006.01) |

(52) U.S. Cl.
CPC .......... *C23C 16/52* (2013.01); *C23C 16/4408* (2013.01); *C23C 16/45527* (2013.01); *C23C 16/45555* (2013.01); *G01K 17/08* (2013.01)

(58) Field of Classification Search
None
See application file for complete search history.

(56) References Cited

U.S. PATENT DOCUMENTS

| | | | | |
|---|---|---|---|---|
| 5,081,421 | A | 1/1992 | Miller et al. | |
| 5,698,989 | A | 12/1997 | Nulman | |
| 5,846,373 | A | 12/1998 | Pirkle et al. | |
| 7,473,031 | B2 | 1/2009 | Wolkin et al. | |
| 8,604,440 | B2 * | 12/2013 | Frisch | G01T 1/363 250/367 |
| 2004/0266011 | A1 | 12/2004 | Lee et al. | |
| 2005/0229847 | A1 | 10/2005 | Bast et al. | |
| 2011/0268148 | A1 * | 11/2011 | King | G01N 25/4813 374/E17.003 |
| 2014/0303019 | A1 * | 10/2014 | Lee | C12Q 1/25 435/7.1 |

(Continued)

FOREIGN PATENT DOCUMENTS

| | | | | |
|---|---|---|---|---|
| KR | 20180071120 | * | 6/2018 | |
| WO | WO-2020065269 A1 | * | 4/2020 | G01K 7/04 |

OTHER PUBLICATIONS

Rohm Semiconductor "Basics of thermal resistance and heat dissipation" <https://fscdn.rohm.com/en/products/databook/applinote/common/basics_of_thermal_resistance_and_heat_dissipation_an-e.pdf> Accessed on Mar. 15, 2025 (Year: 2025).*

(Continued)

*Primary Examiner* — Mandy C Louie
(74) *Attorney, Agent, or Firm* — Foley & Lardner LLP

(57) ABSTRACT

A calorimetry sensor having a porous substrate and a temperature sensitive resistive coating. The calorimetry sensor has a known temperature coefficient of resistance. A process utilizes the known temperature coefficient of resistance and monitors changes in resistance of the calorimetry sensor to determine changes in temperature (heat) within an environment, such as during reactions within an ALD reactor.

6 Claims, 21 Drawing Sheets

(56) References Cited

U.S. PATENT DOCUMENTS

2018/0313800 A1* 11/2018 Rogers ............... G01N 33/0016

OTHER PUBLICATIONS

Bielinski, et al., "Pyroelectric Heat Detection for Calibrated Measurement of Atomic Layer Deposition Reaction Heat," Chemistry of Materials 33(15), pp. 6176-6185 (2021).
Elam & George, "Growth of ZnO/Al2O3 Alloy Films Using Atomic Layer Deposition Techniques," Chemistry of Materials 15(4), pp. 1020-1028 (2003).
Lee, et al., "Atomic Layer Deposition of AlF3 Using Trimethylaluminum and Hydrogen Fluoride," The Journal of Physical Chemistry C 119(25), pp. 14185-14194 (2015).
Lownsbury, et al., "Direct Measurements of Half-Cycle Reaction Heats during Atomic Layer Deposition by Calorimetry," Chemistry of Materials 29(20), pp. 8566-8577 (2017).
Mane & Elam, "Atomic Layer Deposition of W:Al2O3 Nanocomposite Films with Tunable Resistivity," Chemical Vapor Deposition 19(4-6), pp. 186-193 (2013).
Nilsen & Fjelvag, "Measuring the heat evolved from individual reaction steps in atomic layer deposition," Journal of Thermal Analysis and Calorimetry 105(1), pp. 33-37 (2011).
Rahtu, et al., "In Situ Quartz Crystal Microbalance and Quadrupole Mass Spectrometry Studies of Atomic Layer Deposition of Aluminum Oxide from Trimethylaluminum and Water," Langmuir 17(21), pp. 6506-6509 (2001).

* cited by examiner

| ALD Process | Delta H for TMA (kcal) | Delta H for H2O (kcal) | Measured T (K) For Al precursor | Measured T (K) For H2O |
|---|---|---|---|---|
| Al2O3 TMA-H2O | -87.74 (HSC **Predicted**) | -58.49 (HSC **Predicted**) | 0.75 (TMA) | 0.57 |
| Al2O3 TDMA-Al-H2O | -28.52 (Measured ) | -78.33 **(Measured )** | 0.24 (TDMA-Al) | 0.76 |

CALORIMETRY METHOD TO MEASURE CHEMICAL REACTION HEAT IN ALD/ALE PROCESSES USING TEMPERATURE-SENSITIVE RESISTANCE COATINGS

TECHNICAL FIELD

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates generally to a calorimetry method to measure chemical reaction heat in atomic layer deposition ("ALD")/atomic layer etching ("ALE") process using temperature-sensitive resistance coatings.

BACKGROUND

Atomic fabrication techniques continue to develop further applications. ALD and ALE processes are routinely used in 3D semiconductor device fabrications and various other emerging applications, including roll-to-roll ALD processing (packaging application). ALD and ALE both have well known chemical pathways utilized for the respective processes, using established precursors, yet new chemical pathways, such as the use of new precursors and reaction environments, continue to be developed.

One challenge presented by ALD and ALE processes is the complexity of the kinetics and thermodynamics, particularly as the processes are considered at a more granular level. For example, many desired materials are already approaching their physical limits of few atomic monolayers where surface-interface reaction is major dominating factor where ALD/ALE methods are essential. Thus, estimating accurate reaction heat in ALD/ALE processes is very important and necessary for understanding: precursor's reaction kinetic, thermodynamics, temporal, or spatial resolutions of ALD/ALE processes, and process selectivity and nucleation study. Further, understanding the kinetics and thermodynamics, including the ability to accurately estimate heat in the ALD/ALE process, has implications on precursor economics, its delivery and utilization on ultra-high aspect ratio ("UAR") and high surface area substrates. As rare components become a more critical component not simply in terms of cost but in security of supply sources, the economics and efficiency of the ALD/ALE process become more important.

While estimating accurate reaction heat in ALD and ALE processes is desirable, it is also recognized as a significantly complex task. Growth kinetics, thermodynamics, and complexities of even well-studied ALD process half-reactions remain unsatisfactorily resolved experimentally to test present computational predicted ALD precursor reactions. Existing attempts to track the heat during an ALD/ALE process require complex state of the art systems and precise calibration (difficult task), most often providing offset results, such as through infrared ("IR") thermal imaging and optical pyrometry. Thus, existing technologies exhibit a range of issues, including poor accuracy, difficulty mapping slow reactions, addressing precursor diffusion, and accounting for varying degrees of process uniformity. A need remains for a process and system for measuring and monitoring heat during ALD/ALE processes.

SUMMARY

Embodiments described herein relate generally to An atomic layer deposition process comprising providing within an atomic layer deposition reactor a calorimetry sensor comprising porous substrate having a temperature sensitive resistive coating, and depositing a first resistive coating by an atomic layer deposition process on an ALD substrate positioned in an ALD reactor including. The ALD comprising exposing a first precursor to the ALD substrate in the ALD reactor, purging the ALD reactor of the first precursor, exposing a co-reactant to the ALD substrate; and purging the co-reactant, continuously monitoring the resistance of the porous substrate during deposition; and determining a change in temperature associated with the depositing based on the monitored resistance of the calorimetry sensor and a known temperature coefficient of resistance for the calorimetry sensor.

Another embodiments relates to a calorimetry process comprising monitoring the resistance of a calorimetry sensor comprising a resistive porous substrate having a porous substrate and a temperature sensitive resistive conformal coating, determining a first change in resistance of the resistive porous substrate, and determining a change in heat based upon the first change in resistance and a known thermal coefficient of resistance for the resistive porous substrate.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are not, therefore, to be considered limiting of its scope, the disclosure will be described with additional specificity and detail through use of the accompanying drawings.

FIG. 1A shows TCR values controlling through metal component in $Al_2O_3$ matrix. FIG. 1B shows TCR values controlling through dielectric component keeping metal component same.

FIG. 2A illustrates bare CGA. FIG. 2B illustrates the tunable resistive coated CGA. FIG. 2C illustrates a magnified view of a portion of the MCP illustrating individual pores with tunable resistive layer.

FIG. 3A illustrates the MCP cross section SEM and ALD tunable resistive coating. FIG. 3B illustrates a magnified view of a portion of the MCP illustrating individual pores. FIG. 3C illustrates a single pore of a MCP in plain view with ALD tunable resistive coating.

FIG. 4A shows MCP with ALD nanocomposite coated MCP in test apparatus; FIG. 4B illustrates parallel resistance arrangement which can be considered as an equivalent circuit for the calorimetry sensor.

FIG. 7A shows $2AlC_3H_9(g)+3H_2O(g)=Al_2O_3+6CH_4(g)$. FIG. 7B shows $AlC_3H_9(g)+3HF(g)=AlF_3+3CH_4(g)$. FIG. 7C shows $Zn(C_2H_5)_2(g)+H_2O(g)=ZnO+2C_2H_6(g)$.

FIG. 9A shows deposition by multiple (4) trimethylaluminum ("TMA") and multiple (4) $H_2O$ precursors. FIG. 9B shows steady state deposition by dosing TMA and $H_2O$ alternately. ALD temperature of 53° C. and MCP TCR of −0.0155.

FIG. 11A shows deposition by multiple (5) TMA and multiple (5) pyridinium fluoride (HF-Py) precursor pulses. FIG. 11B shows steady-state deposition by dosing TMA and HF alternately. ALD temperature of 100° C. and MCP TCR of −0.028. FIG. 11C is a reaction heat comparison of calculated and experimentally measured values for $Al_2O_3$ and $AlF_3$ ALD processes.

FIG. 12A shows deposition by multiple (5) Al-tetrakisdimethylamido aluminum ("TDMA-Al") and multiple (5) $H_2O$ precursors. FIG. 12B shows steady state deposition by dosing TDMA-Al and $H_2O$ alternately; ALD temperature of 100° C. and MCP TCR of −0.028. FIG. 12C shows reaction heat comparison of calculated and experimentally measured for $Al_2O_3$ using two different set of ALD precursors: TMA-$H_2O$ and TDMA-Al—$H_2O$.

FIG. 13A shows deposition by multiple (6) TDMA-Al and multiple (6) HF-py precursors. FIG. 13B shows steady state deposition by dosing TDMA-Al and Hf-Py alternately.

FIG. 14C further illustrates the transition of the ZnO to conductive.

FIG. 17A shows dosage pulses and pressure over time and respective precursor dose valve openings. FIG. 17B illustrates in-situ resistance.

FIG. 17C illustrates residual gas analyzer signals from $CH_3$ and $CH_4$.

FIG. 18A shows dosage pulses and pressure over time and respective precursor dose valve openings. FIG. 18B illustrates in-situ resistance.

FIG. 18C illustrates residual gas analyzer signals from $CH_3$ and $CH_4$.

Figure 1A:
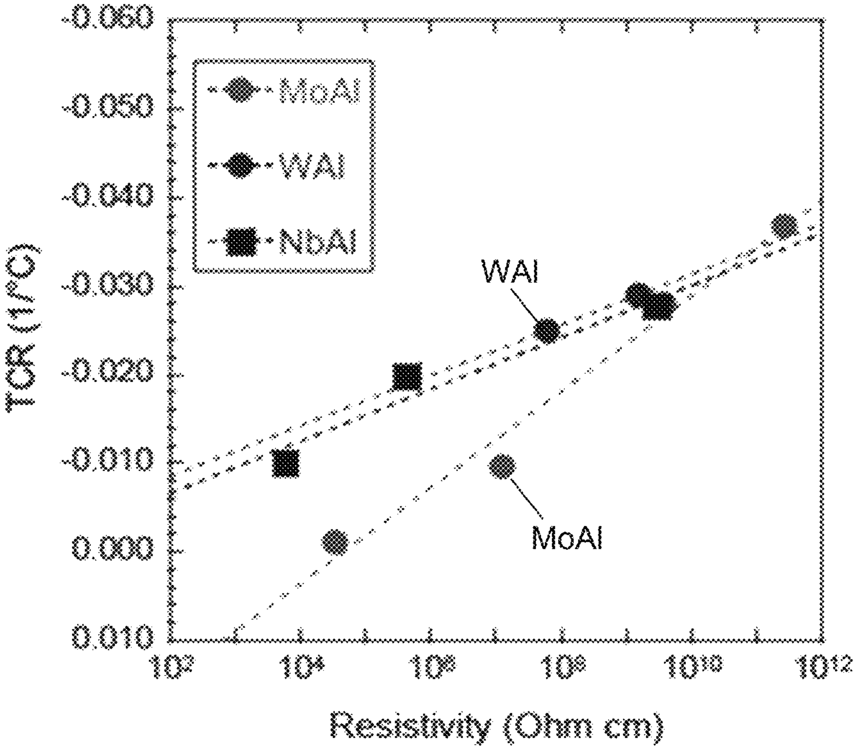
FIGS. 1A-1B illustrate the various ALD nanocomposite resistive coatings temperature coefficient of resistance ("TCR") measurement.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

To enhance calorimetry measurement sensitivity factor, a desire temperature sensitive resistive coating can be applied to the well-defined high surface area porous substrate templates, such as MCP, CGA anodic aluminum oxide ("AAO"), through substrate vias referred to as interposers (glass, silicon, plastic) substrates, interdigitated metal electrode structures, etc., and can be used for calorimetry. The temperature sensitive resistive coating may be applied by ALD or CVD or vapor phase transport ("VPT") methods.

Figure 1B:
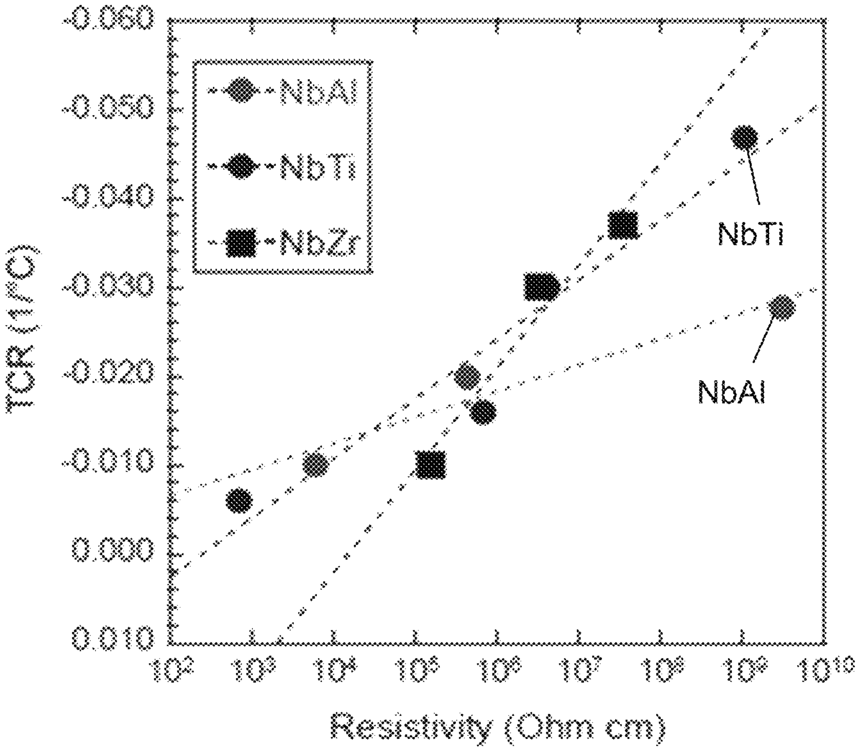

The TCR of thin film coatings can be controlled by various mechanisms. For example, FIGS. 1A-1B illustrate example ALD nanocomposite resistive coatings and their TCR measurement. TCR values can be controlled through metal component in $Al_2O_3$ matrix (see, FIG. 1A). TCR values can also be controlled through dielectric component keeping metal component same (see, FIG. 1B).

In a particular embodiment, a process may utilize an ALD resistive coated substrate, such as a MCP, with well-defined temperature coefficient of resistance value (TCR range=±0.1-1) for chemical reaction heat measurement in predominantly for ALD/ALE processes precursors reaction. Examples described below set forth a methodology of using MCP and demonstrate the calorimetry studies of ALD/ALE processes. The value obtained from the MCP resistance change during ALD/ALE process reaction heat are very close to the thermodynamic reaction energy calculations. Further, reaction heat measurements can also be made for each ALD precursor-surface reaction step. In some embodiments, the calorimetry method can be used for in-situ ALD/ALE process growth monitoring especially for insulating materials (e.g., oxides, sulfides, and fluorides) growth.

Those of skill in the art will appreciate that described herein is a novel, very precise calorimetry method that will help to understand the heat of reaction in ALD/ALE processes for various ALD-CVD precursors. This will also help ALD/ALE process optimization, precursor selection and effective utilization of the precursors. The described calorimetry method and system provides a tool for process optimization especially for complex high aspect ratio features on device wafers or coating of interposer substrates for multilevel integrated circuit applications very efficiently.

In one embodiment, ALD is utilized. In its simplest form, the ALD process consists of two half-cycles, each typically consisting of two steps (exposure of two different precursors). In a first half-cycle, in a first step, a first precursor binds to the surface of the substrate (adsorption), and the excess first precursor, along with the byproducts formed, are then purged in the next step. In a second half-cycle, a second precursor (or co-reactant) is added to react with the adsorbed/bound intermediate entity formed by the first precursor. The excess second precursor and byproducts are then purged out, completing the full ALD cycle. The reaction of the second precursor with the first adsorbed entity forms a deposited material.

It should be appreciated that more complicated ALD schemes can be constructed as a super-cycle comprising various sub-cycles for depositing a material as described or for depositing multiple different materials for multiple dopants or formation of bi- (tri-, etc.) metallic materials, such as varying the parameters for any of the individual steps within a cycle. In one embodiment, the deposition may be a doped layer, a multi-layer, or a mixed metal composite. The respective pulse and purge times may be the same time or may be different for the different metal precursors and co-reactants.

ALE proceeds through a traditional "ALD" half-reaction process where a first precursor binds to the surface of the material to be etched (adsorption), the first precursor is purged, and then a second precursor (or co-reactant) is added to react with the adsorbed entity formed by the first precursor. The reaction of the second precursor removes the material deposited by the first precursor reaction, including material from the substrate, such as a single atom of the substrate.

Figures 2A, 2B:
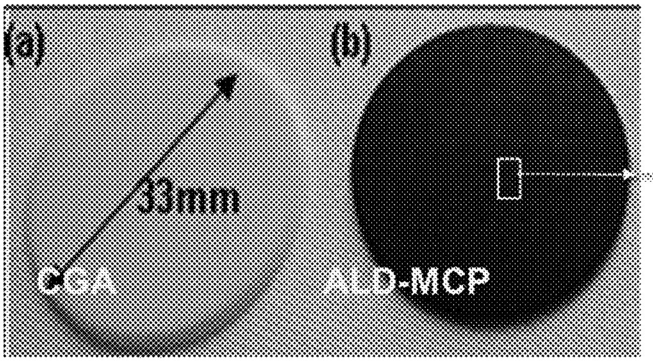
FIGS. 2A-2C illustrate top view of microchannel plate ("MCP")/capillary glass array ("CGA").
Figure 2C:
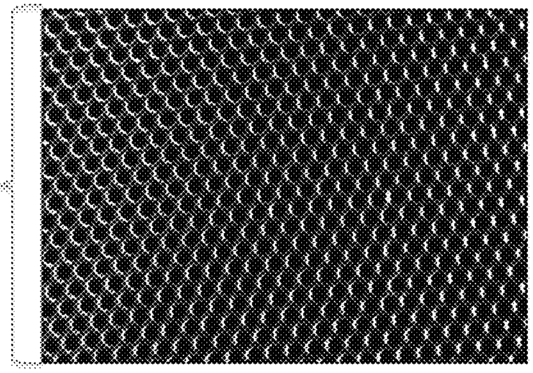

In one embodiment, the general ALD/ALE process includes a substrate that is reacted with a first precursor in the first half reaction to form a first intermediate entity (typically adsorbed to the substrate) having a metal from the first precursor. In a second half reaction, a second precursor, such as a reducing agent, is exposed to the first intermediate entity and reacted to form deposited material. Some embodiments, particularly for ALD, relate to a process for forming a more complex ALD deposition through supercycle of a first reaction between a first precursor and a co-reactant and second reaction between a second precursor and a co-reactant, where the first and second reaction may be in equal cycles or unequal cycles. FIGS. 2A-2C illustrate one embodiment of such a process, illustrating a glass capillary array substrate (FIG. 2A) coated with an ALD tunable resistive coating to form a MCP (FIGS. 2B-2C). Further uses of multiple precursors for depositing different layers of materials, dopants, or the like may be utilized. Those of skill in the art will further appreciate that ALD process parameters may be altered to achieve a desired deposition, including through use of cycles with different parameters in an overall supercycle.

The ALD/ALE occurs with a substrate serving as the initial deposition surface. The substrate may be high aspect ratio and ample surface area for accommodating conformal ALD such as aerogels, membranes, filters, separators, photonic structures, and nanotubes.

In one embodiment, the ALD process includes a first precursor. The first precursor may be, for example, a material reactive or absorbable on the substrate to form a first ALD intermediate. In one embodiment, the ALD process includes a first co-reactant. The first co-reactant may be, for example, $H_2O$, $O_3$, $H_2O_2$, $N_2O$, $Si_2H_6$, or hydroxymethylene ("HCOH"), and reactive with the ALD first intermediate.

In one embodiment, each ALD process consists of a cycle, which may be repeated to form a desired thickness of film. A cycle consists of a precursor vapor pulse for an exposure followed by a purge, such as where the reactor is pumped to a vacuum, followed by a co-reactant pulse with a co-reactant exposure followed by a co-reactant purge. It should be appreciated that the dose and purge time is based on the self-limiting behavior of the precursors/co-reactants. This can be varied in a wide range from a few milliseconds to tens of seconds. Further if a longer dose than purge time is utilized, the times may need to increase to avoid a CVD-type reaction, which can result in non-uniformity and particle formation.

Typically, the ALD process takes place in a temperature controlled reactor. In some embodiments, the substrate can be heated to a predetermined temperature during the ALD process. For example, the first predetermined temperature can be in the range of 50-350° C. (e.g., 50, 60, 70, 80, 90, 100, 110, 120, 130, 140, 150, 160, 170, 180, 190, . . . 350° C., inclusive of all ranges and values therebetween). In some embodiments, the first predetermined temperature is in the range of 100-350° C. (e.g., 225° C.). Temperature also impacts the overall energy in the system and the performance for diffusion and/or reaction. In an ALD process, the deposition temperature range where more or less same growth as function of growth occurs is referred to as the "ALD window." The ALD reaction should occur at a temperature of the precursor which sufficient to give constant precursor's evaporation rate (i.e., vapor pressure). If vapor pressure is not enough, there may still be layer growth, but the surface coverage will be poor because the reaction does not achieve saturation. If the vapor pressure is too much, it will waste precursor, and there may be CVD growth if there is not sufficient purge time due to mixing of precursors. The temperature of the layer growth can be as low as the subliming temperature of the ALD precursors. For example, if a precursor sublimes at 150° C., films can also grow around that temperature. But generally layer growth temperature is at least 10-50° C. higher than the precursor sublimation temperature. Further, in some embodiments, a plasma can be used as the co-reactant or to enhance the growth rate or tailor the composition of the deposited layer.

In some embodiments, the first precursor is a vapor and the first precursor pulse comprises input to the reactor of a first precursor vapor for a first precursor pulse time of a few milliseconds to tens of seconds (e.g., 0.005, 0.01, 0.05, 0.1, 0.5, 1, 5, 10, 20, or 30 seconds, inclusive of all ranges and values therebetween). The first partial pressure of the first precursor pulse can be in the range of 0.01-1000 Torr (e.g., 10, 25, 50, 75, 100, 500, or 1000 Torr, inclusive of all ranges and values therebetween), such as, in one embodiment, at least 0.5-100 Torr. One of skill in the art will appreciate that the time length, pressure, and amount of precursor for the pulse are all factors in determining the overall amount for each of those operation parameters. For example, the pressure and amount may follow from the duration of the pulse but depend on the size of the chamber and the type of valve as would be understood from general knowledge regarding ALD. Note, for ease of reference herein, the process is described with regard to the pulse duration, but it should be understood that the precursor partial pressure is another means to control the precursor dose. A carrier gas, such as argon or other non-reactive (with the substrate or the precursors) gas, may be used.

In some embodiments, the first precursor exposure comprises exposing the substrate to the first precursor for a first exposure time and a first partial pressure of the first precursor so that the first precursor binds with the substrate or a coating from prior ALD cycles on the substrate. In some embodiments, given the short time for the pulse/exposure for the ALD process the pulse lasts the entire exposure until the purge starts with the pulse time and exposure time being the same. The first precursor pulse time may be less than the first exposure time, or they may be equal such that the exposure is the same as the pulse. The first exposure time can be in the range of 0.5-500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds or several minutes, inclusive of all ranges and values therebetween). In some embodiments, the first predetermined time is in the range of 1-10 seconds. The first partial pressure of the first precursor can be in the range of 0.01-10 Torr (e.g., 0.01, 0.05, 0.1, 0.5, 1.0, 5.0, or 10 Torr, inclusive of all ranges and values therebetween). In some embodiments, the first partial pressure of the first precursor is in the range of 0.1-1 Torr. ALD growth can also be performed at various reactor pressures (e.g., $10^{-4}$ to 1000 Torr).

The first precursor purge evacuates unreacted precursor from the reactor. The first precursor purge may be for a first precursor purge time of 0.5-30 seconds (e.g., 0.5, 1, 5, 10, 20, or 30 seconds, inclusive of all ranges and values therebetween), such as 15 seconds. The first precursor purge may evacuate the reactor such that the total pressure is reduced substantially to vacuum. Alternatively, the first precursor purge may consist of a constant flow of high purity carrier gas at a constant pressure that sweeps the unreacted precursor from the reactor. In either case, the first precursor purge reduces the partial pressure of the precursor in the reactor by a factor of $10^2$ to $>10^9$ (e.g., from an initial value of 1 Torr immediately following the first precursor exposure to a final value after the first precursor purge of $10^{-2}$ to $<10^{-9}$ Torr).

In some embodiments, exposing the substrate to first co-reactant for a first co-reactant exposure time and a second partial pressure of the first co-reactant so that first co-reactant reacts with the entity formed by the first precursor reacting with the substrate (or previous ALD deposited coatings). The first co-reactant exposure time can be in the range of 0.5-500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as about 1 second. The second partial pressure of the first co-reactant can be in the range of 0.01-10 Torr (e.g., 0.01, 0.05, 0.1, 0.5, 1.0, 5.0, or 10 Torr, inclusive of all ranges and values therebetween). In some embodiments, the second partial pressure of the first co-reactant is in the range of 0.1-1 Torr (e.g., about 0.5 Torr) such as 0.88 Torr. ALD growth can also performed in various reactor pressure ($10^{-4}$ to 1000 Torr).

The first co-reactant purge evacuates unreacted precursor from the reactor. The first co-reactant purge may be for a first co-reactant purge time of 0.5-500 seconds (0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as 10 seconds. The first co-reactant purge may evacuate the reactor such that the total pressure is reduced substantially to vacuum. Alternatively, the first co-reactant purge may consist of a constant flow of high purity carrier gas at a constant pressure that sweeps the unreacted co-reactant from the reactor. In either case, the first co-reactant purge reduces the partial pressure of the co-reactant in the reactor by a factor of $10^2$ to $>10^9$ (e.g., from an initial value of 1 Torr immediately following the first co-reactant exposure to a final value after the first co-reactant purge of $10^{-2}$ to $<10^{-9}$ Torr.) In some embodiments, the second precursor is a vapor and the second precursor pulse comprises input to the reactor of a second precursor vapor for a second precursor pulse time of a few milliseconds to tens of seconds (e.g., 0.5, 1, 5, 10, 20, or 30 seconds, inclusive of all ranges and values therebetween). The first partial pressure of the second precursor pulse can be in the range of 0.01-1000 Torr (e.g., 10, 25, 50, 75, 100, 500, or 1000 Torr, inclusive of all ranges and values therebetween), such as, in one embodiment, at least 0.5-100 Torr. One of skill in the art will appreciate that the time length, pressure, and amount of precursor for the pulse are all factors in determining the overall amount for each of those operation parameters. For example, the pressure and amount may follow from the duration of the pulse but depend on the size of the chamber and the type of valve as would be understood from general knowledge regarding ALD. Note, for ease of reference herein, the process is described with regard to the pulse duration, but it should be understood that the precursor partial pressure is another means for controlling the precursor dose. A carrier gas, such as argon or another non-reactive (with the substrate or the precursors) gas, may be used.

In some embodiments, the second precursor exposure comprises exposing the substrate to the second precursor for a first exposure time and a first partial pressure of the second precursor so that the second precursor binds with the substrate or a coating from prior ALD cycles on the substrate. In some embodiments, given the short time for the pulse/exposure for the ALD process the pulse lasts the entire exposure until the purge starts with the pulse time and exposure time being the same. The second precursor pulse time may be less than the first exposure time, or they may be equal such that the exposure is the same as the pulse. The first exposure time can be in the range of 0.5-500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween). In some embodiments, the first predetermined time is in the range of 1-10 seconds. The first partial pressure of the second precursor can be in the range of 0.01-10 Torr (e.g., 0.01, 0.05, 0.1, 0.5, 1.0, 5.0, or 10 Torr, inclusive of all ranges and values therebetween). In some embodiments, the first partial pressure of the second precursor is in the range of 0.1-1 Torr.

The second precursor purge evacuates unreacted precursor from the reactor. The second precursor purge may be for a second precursor purge time of 0.5-30 seconds (e.g., 0.5, 1, 5, 10, 20, or 30 seconds, inclusive of all ranges and values therebetween), such as 15 seconds. The second precursor purge reduces the partial pressure of the second precursor in the reactor by a factor of $10^2$ to $>10^9$ (e.g., from an initial value of 1 Torr immediately following the second precursor exposure to a final value after the second precursor purge of $10^{-2}$ to $<10^{-9}$ Torr.)

After reaction with the second precursor, the substrate is then exposed to a second co-reactant by a second co-reactant pulse introducing the second co-reactant to the reactor and then exposing for the second co-reactant exposure such that the second co-reactant reacts with the second precursor or, more particularly, with intermediate entity formed by the second precursor and the substrate (or ALD coating on the substrate).

In some embodiments, the second co-reactant pulse comprises input to the reactor of the second co-reactant vapor for a second co-reactant pulse time of 0.5-30 seconds (e.g., 0.5, 1, 5, 10, 20, or 30 seconds, inclusive of all ranges and values therebetween), such as 1 second. The first partial pressure of the second co-reactant pulse can be in the range of 0.01-10 Torr (e.g., 0.01, 0.05, 0.1, 0.5, 1.0, 5.0, or 10 Torr, inclusive of all ranges and values therebetween), such as 0.88 Torr.

In some embodiments, exposing the substrate to second co-reactant for a second co-reactant exposure time and a second partial pressure of the second co-reactant so that second co-reactant reacts with the entity formed by the second precursor reacting with the substrate (or previous ALD deposited coatings). The second co-reactant exposure time can be in the range of 0.5-500 seconds (e.g., 0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as about 1 second. The second partial pressure of the second co-reactant can be in the range of 0.01-10 Torr (e.g., 0.01, 0.05, 0.1, 0.5, 1.0, 5.0, or 10 Torr, inclusive of all ranges and values therebetween). In some embodiments, the second partial pressure of the second co-reactant is in the range of 0.1-1 Torr (e.g., about 0.5 Torr), such as 0.88 Torr.

The second co-reactant purge evacuates unreacted precursor from the reactor. The second co-reactant purge may be for a second co-reactant purge time of 0.5-500 seconds (0.5, 1, 5, 10, 20, 30, 40, 50, 60, 70, 80, 90, 100, 120, 140, 160, 180, 200, 220, 240, 260, 280, 300, 350, 400, 450 or 500 seconds, inclusive of all ranges and values therebetween), such as 10 seconds. The second co-reactant purge reduces the partial pressure of the second co-reactant in the reactor by a factor of $10^2$ to $>10^9$ (e.g., from an initial value of 1 Torr immediately following the second co-reactant exposure to a final value after the second co-reactant purge of $10^{-2}$ to $<10^{-9}$ Torr.)

In one embodiment, a calorimetry method and device are utilized as part of the ALD/ALE process. A temperature sensitive resistive coating having a known TCR value is utilized on a porous substrate.

Figure 3A:
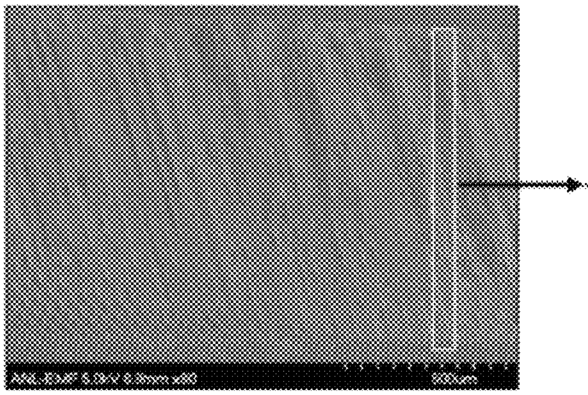
FIGS. 3A-3C illustrate a microchannel plate having ALD resistive coating on a porous microcapillary glass array.
Figure 3B:
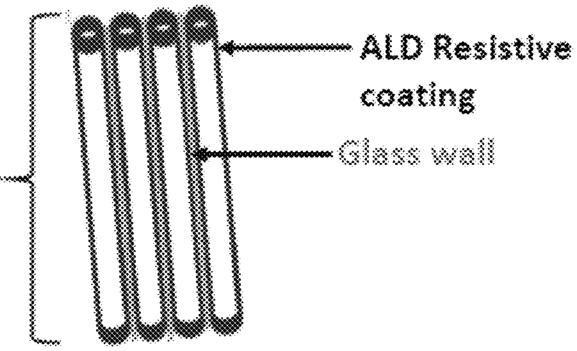
Figure 3C:
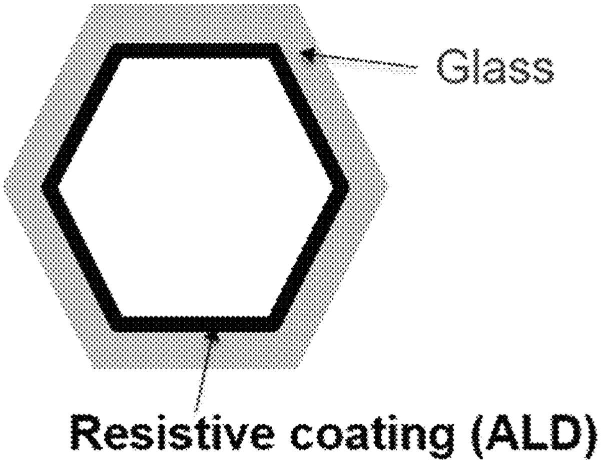

The substrate for initial deposition is selected from among a group of high surface area porous substrates, such as micro channel plate, through glass via, through silicon via, through plastic via, anodic aluminum oxide, fiber plates, or the like. Alternatively, an inherently conductive substrates, such as Pb glass microcapillary arrays, maybe used. FIGS. 3A-3C illustrate a microchannel plate having ALD resistive coating on a porous microcapillary glass array. FIG. 3A illustrates the MCP cross section SEM and ALD tunable resistive coating. FIG. 3B illustrates a magnified view of a portion of the MCP illustrating individual pores. FIG. 3C illustrates a single pore of a MCP in plain view with ALD tunable resistive coating.

Figure 8:
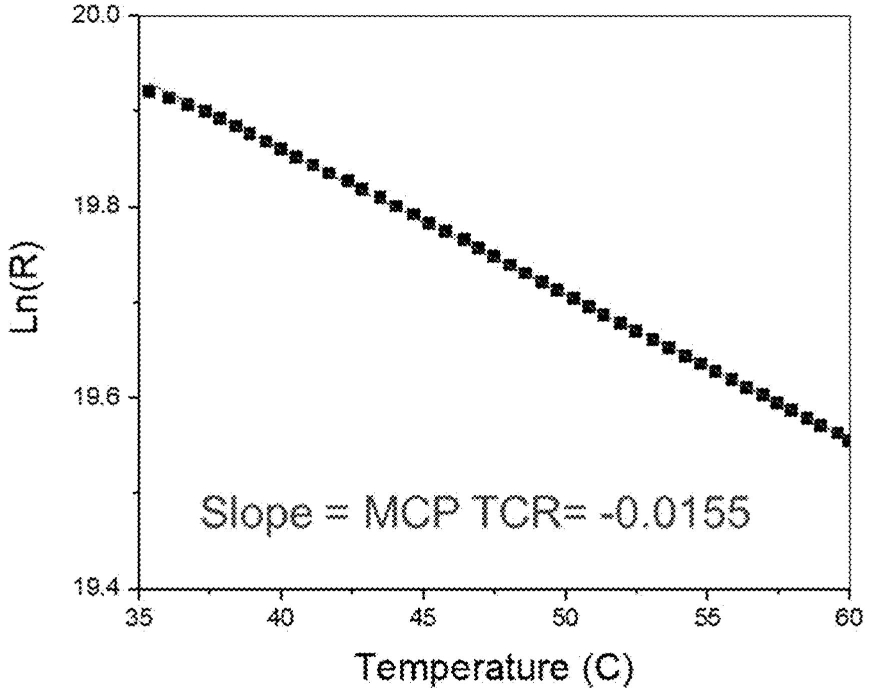
FIG. 8 is a graph of an ALD-MCP resistance verses temperature (MCP having resistance of 220 Mohm at 50° C. coated with WAlO via ALD) where the slope of this graph represents TCR of the ALD coating and is identified as −0.0155.

A resistive coating may be deposited on the substrate forming an ALD-coated material. The resistive coating may be deposited by ALD and have a known TCR value. The TCR value for the coated substrate can be controlled and tuned, such as through a selected metal to be deposited or a selected dielectric as the substrate. It should be appreciated, as discussed further with regard to the results presented in FIGS. 14A-14C, that an ALD coating may be resistive under some circumstances, such as below a certain thickness. In one embodiment, an ALD-functionalized porous MCP may be utilized with a resistive deposited ALD coating that has a selected (tunable) TCR. As used herein, "TCR" refers to the slope of the natural log of the resistance plotted versus the temperature. The resistive value of a resistive coating, for example, changes with temperature. FIG. 4 illustrates a general form of resistance testing for a MCP. FIG. 8 illustrates an example of a graph of resistance indicating a TCR for the tested MCP.

Figure 4A:
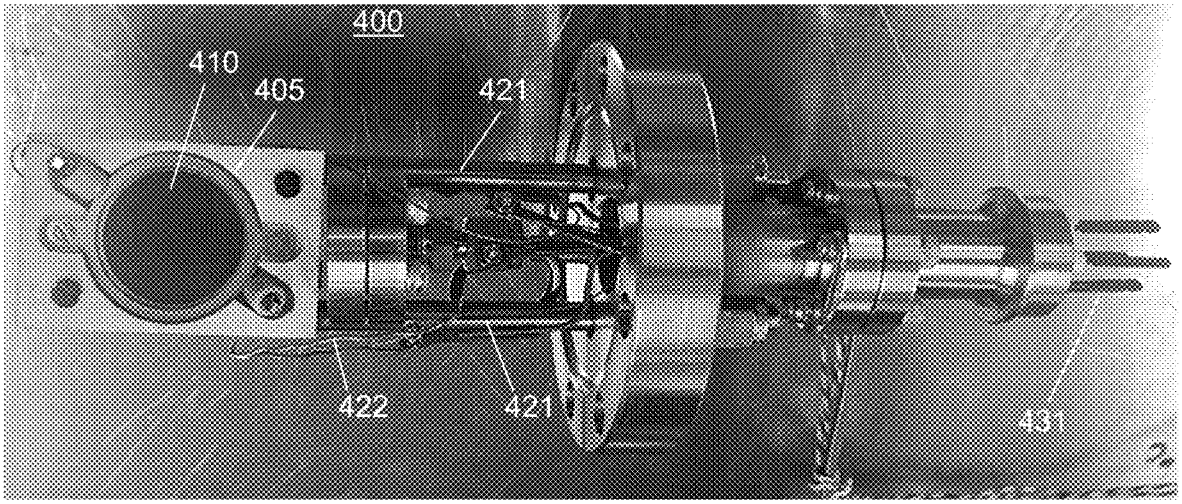
FIGS. 4A-4B illustrate a resistance measurement test apparatus
Figure 4B:
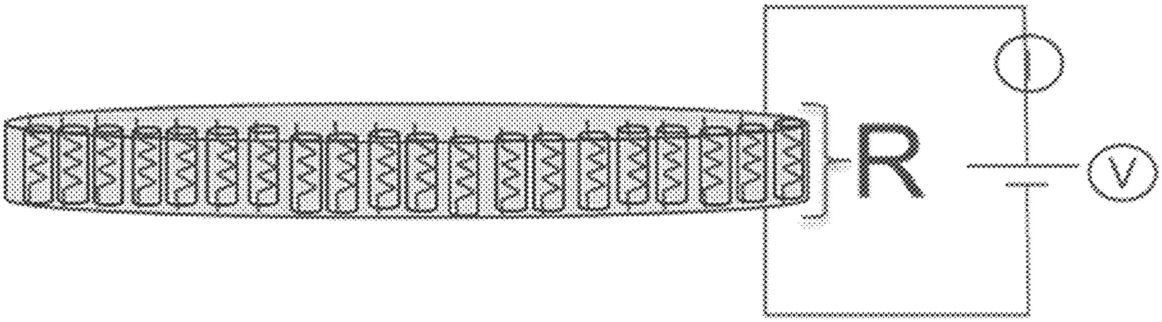

FIGS. 4A-4B illustrate a calorimetry sensor as a resistance test apparatus and setup for testing a MCP with ALD nanocomposite coating. FIG. 4A illustrates sensor device 400 with a dedicated porous substrate having a temperature sensitive resistive coating 410 positioned in a holder 405. One or more heating elements 421, one or more thermocouples 422 in communication with the substrate 410, and one or more electrical connections 431 in communication with the substrate 410. The device 400 may be configured to engagement in a reactor. FIG. 4B illustrates parallel resistance arrangement, which can be considered the equivalent circuit for a calorimetry sensor. The calorimetry sensor, in one embodiment, includes a resistance circuit that includes the resistive coating, effectively allowing the resistance of the calorimetry sensor to be monitored.

Figure 5A:
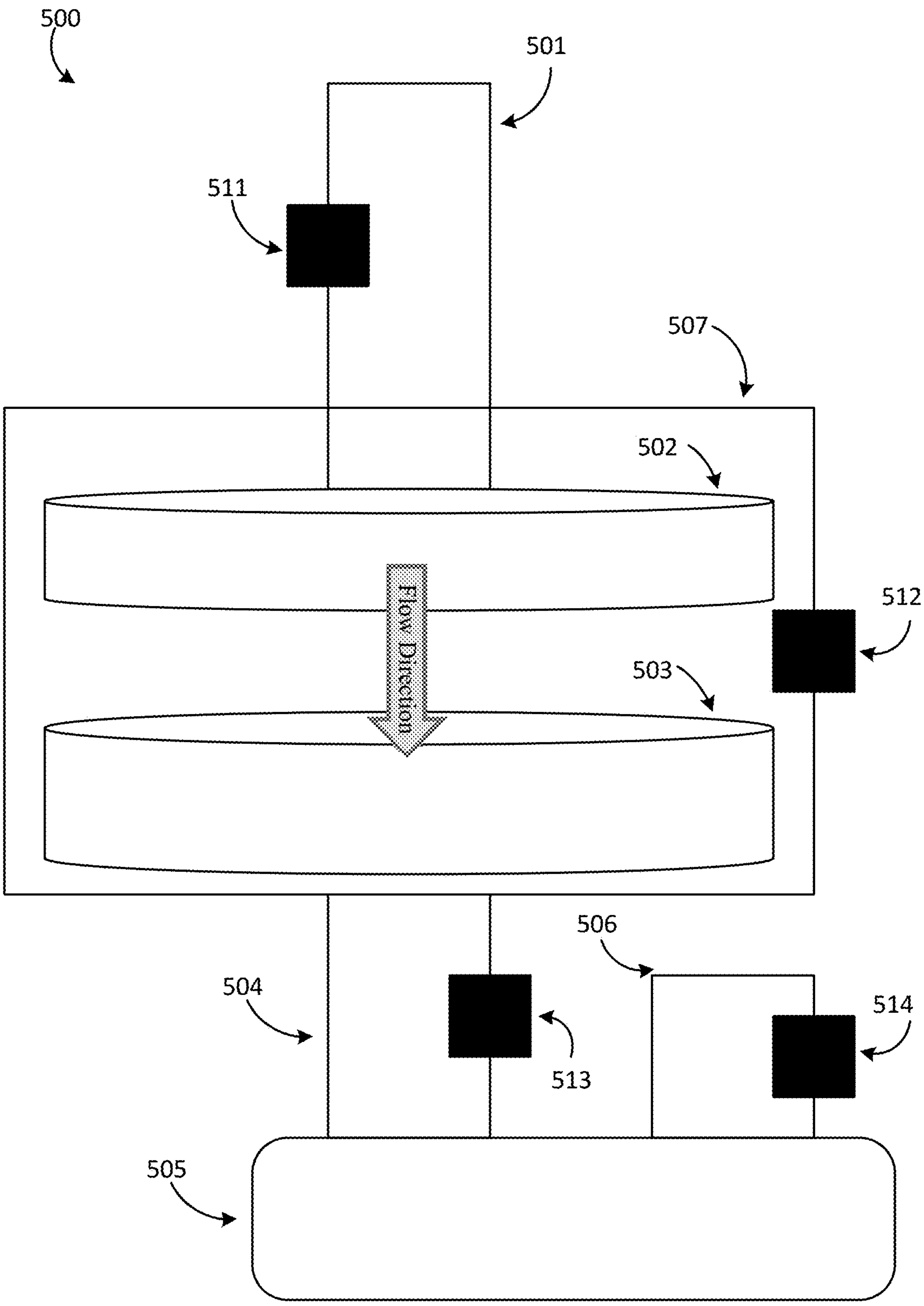
FIG. 5A illustrates an integrated calorimetry sensors addition in shower head ALD/chemical vapor deposition ("CVD")/ALE/reactive ion etching ("RIE") apparatus arrangement.
Figure 5B:
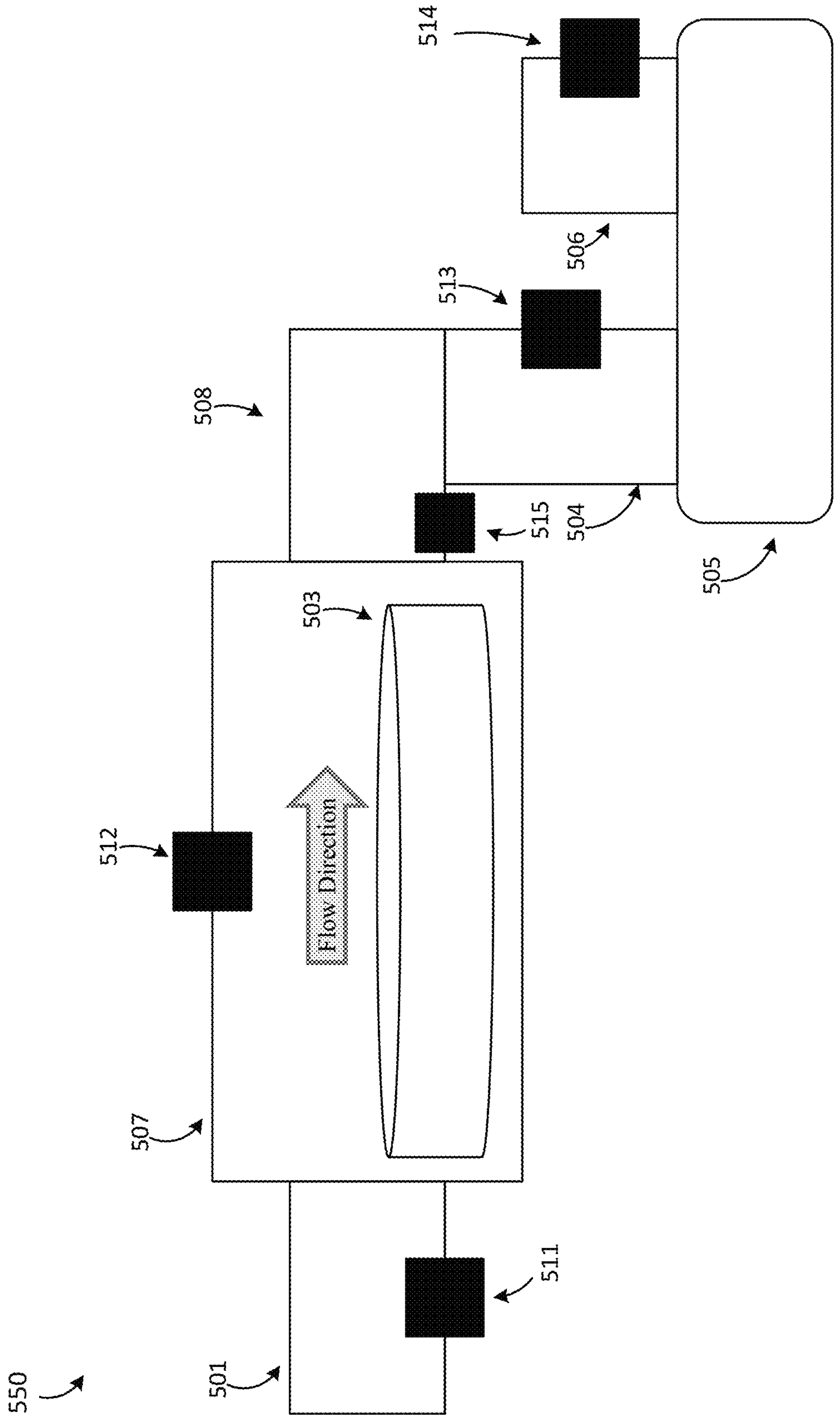
FIG. 5B illustrates an integrated calorimetry sensors addition in cross-flow ALD/CVD/ALE/RIE apparatus arrangement.
Figure 6:
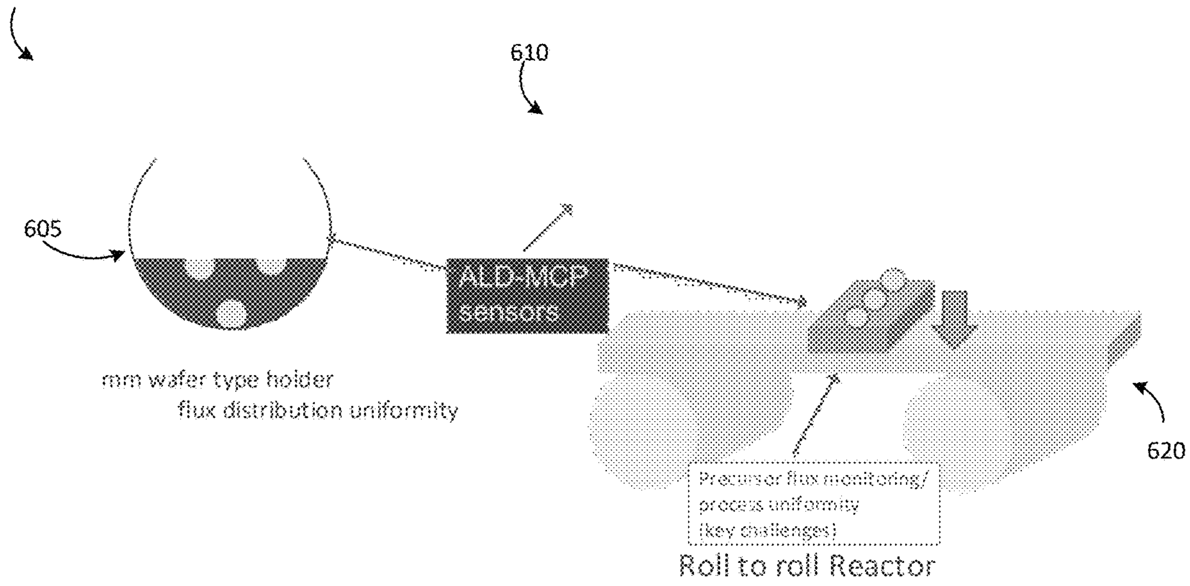
FIG. 6 illustrates an integrated calorimetry sensor array addition for shower head, cross flow ALD reactor, and roll to roll arrangement for ALD/CVD/ALE/RIE apparatus arrangement for monitoring process uniformity.

FIG. 5A shows an integrated calorimetry sensor(s) in a showerhead-type reactor 500 for ALD/CVD/ALE/REI etc. FIG. 5B shows an integrated calorimetry sensor(s) in a cross-flow reactor 550 for ALD/CVD/ALE. FIG. 6 illustrates a calorimetry component for an ALD/ALE process. The integrated calorimetry sensors may be positioned in the showerhead-type reactor 500 and the cross-flow reactor 550: a first calorimetry sensor 511 at the precursor inlet 501 leading to a reaction chamber 507; a second calorimetry sensor 512 above the substrate stage, such as a pedestal heater 503; a third calorimetry sensor 513 at the reaction outlet 504. A pumping system 505 may be provided and include an exhaust system 506 that includes a fourth calorimetry sensor 514. It should be appreciated that the reactor may utilize calorimetry sensors positioned in different locations and may include alternative stages for an ALD/ALE substrate, a thermocouple, one or more heating elements, such as rod heaters, electrical connection components, and other components known in the art. As shown in FIG. 5B, in some embodiments, the reactor 500 includes a precursor outlet 508 between the chamber 507 and the reaction chamber outlet 504. In some embodiments, there is a fifth calorimetry sensor 515 positioned at the precursor outlet 508. While FIG. 5A shows a single calorimetry sensor, third calorimetry sensor 513, in the substrate region of the showerhead-type reactor 500, there may be an array of calorimetry sensors, as shown by 605 in FIG. 6, to allow for a spatial mapping of the calorimetry signals. Similarly, while FIG. 5B shows a single calorimetry sensor 513 in the substrate region of the cross-flow reactor 550, there may be an array of calorimetry sensors, as shown by 610 in FIG. 6 to allow for spatial mapping of the calorimetry sensors. While FIGS. 5A-5B show showerhead and cross-flow configurations, as FIG. 6 illustrates, a roll-to-roll reactor 620 can also integrate calorimetry sensors 511, 512, 513, 514, 515.

FIG. 6 illustrates an integrated calorimetry sensor(s) 511, 512, 513, 514, 515 addition for shower head 605, cross flow 610, and roll-to-roll 620 arrangements for an ALD/CVD/ALE/RIE reactor.

Figure 7A:
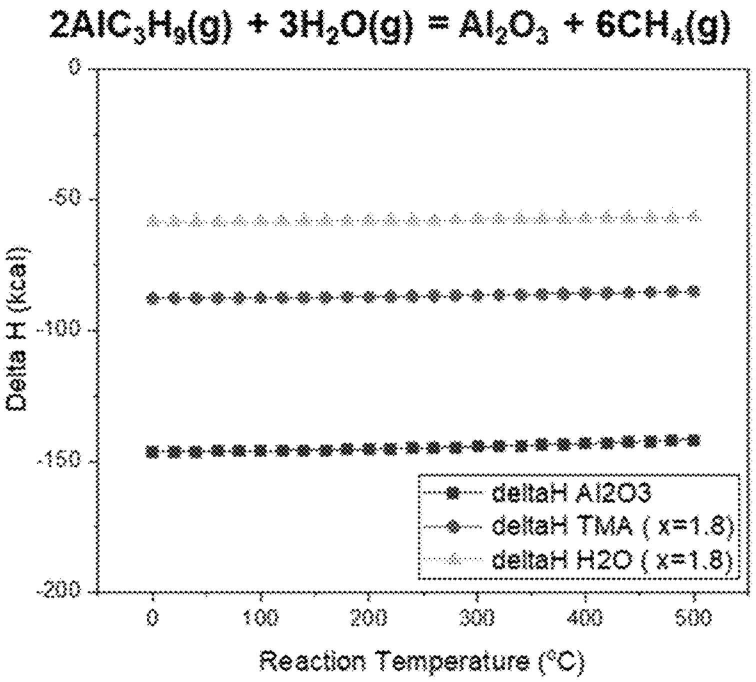
FIGS. 7A-7C show thermodynamic calculations using HSC Chemistry software for ALD $Al_2O_3$, $AlF_3$, and ZnO. These figures show the reaction enthalpy (delta H) for deposited materials and individual half reactions.
Figure 7B:
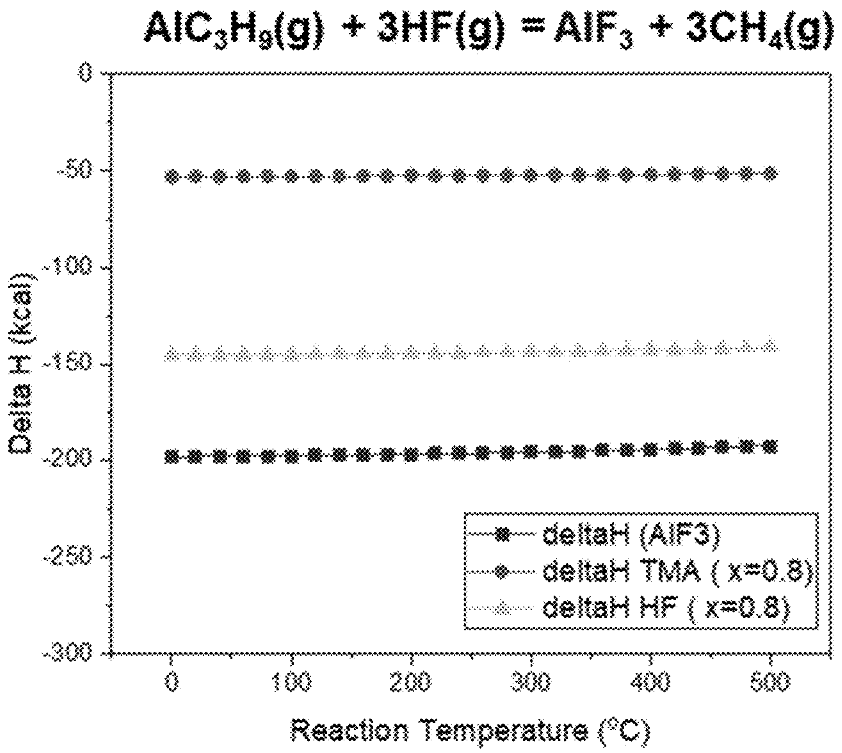
Figure 7C:
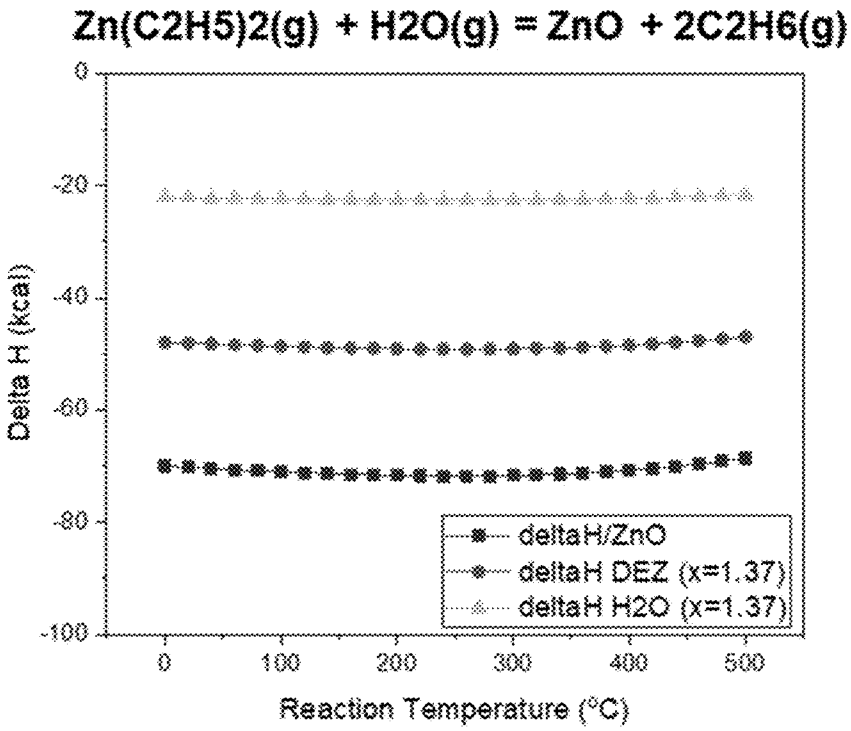

FIG. 7A-7C show thermodynamic calculations using HSC Chemistry software for ALD $Al_2O_3$, $AlF_3$ and ZnO. These graphs show the reaction heat (reaction enthalpy, deltaH) in units of kilocalories per mol of metal atoms for the deposited materials and individual precursors. FIG. 7A shows $2AlC_3H_9(g)+3H_2O(g)=Al_2O_3+6CH_4(g)$. FIG. 7B shows $AlC_3H_9(g)+3HF(g)=AlF_3+3CH_4(g)$. FIG. 7C shows $Zn(C_2H_5)_2(g)+H_2O(g)=ZnO+2C_2H_6(g)$.

The reaction heat for the overall chemical reaction during the ALD/ALE process is calculated, such as by HSC chemistry software. For instance, FIG. 7A shows that at 53° C., the deltaH value for the overall chemical reaction $2AlC_3H_9(g)+3H_2O(g)=Al_2O_3+6CH_4(g)$ is −146 kcal/mol of Al atoms. The deltaH for the overall $Al_2O_3$ ALD chemical reaction can be partitioned into the deltaH for the individual TMA and $H_2O$ half-reactions by assuming that the reaction heat is proportional to the relative amount of $CH_4$ product released during the TMA and $H_2O$ half-reactions. Of the $3CH_4$ released by TMA during $Al_2O_3$ ALD, we know that x=1.8 $CH_4$ are released during the TMA reaction, and (3-x)=1.2 $CH_4$ are released during the $H_2O$ reaction (see RAHTU, et al., "*In Situ Quartz Crystal Microbalance and Quadrupole Mass Spectrometry Studies of Atomic Layer Deposition of Aluminum Oxide from Trimethylaluminum and Water*," Langmuir 17(21), pp. 6506-6509 (2001)). Consequently, deltaH for the TMA half-reaction is expected to be 1.8/3.0*(−146)=−87.6 kcal/mol and deltaH for the $H_2O$ half-reaction is expected to be 1.2/3.0*(−146)=−58.4 kcal/mol, as shown in FIG. 7A. A similar analysis is applied to the deltaH calculations for the $AlF_3$ ALD in FIG. 7B using x=0.8 (see LEE, et al., "*Atomic Layer Deposition of $AlF_3$ Using Trimethylaluminum and Hydrogen Fluoride*," The Journal of Physical Chemistry C 119(25), pp. 14185-14194 (2015)) and for the ZnO ALD in FIG. 7C using x=1.37 (see ELAM & GEORGE, "*Growth of ZnO/$Al_2O_3$ Alloy Films Using Atomic Layer Deposition Techniques*," Chemistry of Materials 15(4), pp. 1020-1028 (2003)).

FIG. 8 is a graph of an ALD-MCP TCR (MCP having resistance of 220 Mohm at 50° C. coated with WAlO via ALD) where coated MCP TCR is identified as −0.023. The TCR determined for the substrate itself, the in-situ resistance changes can be utilized to determine the thermodynamic changes.

Figure 9A:
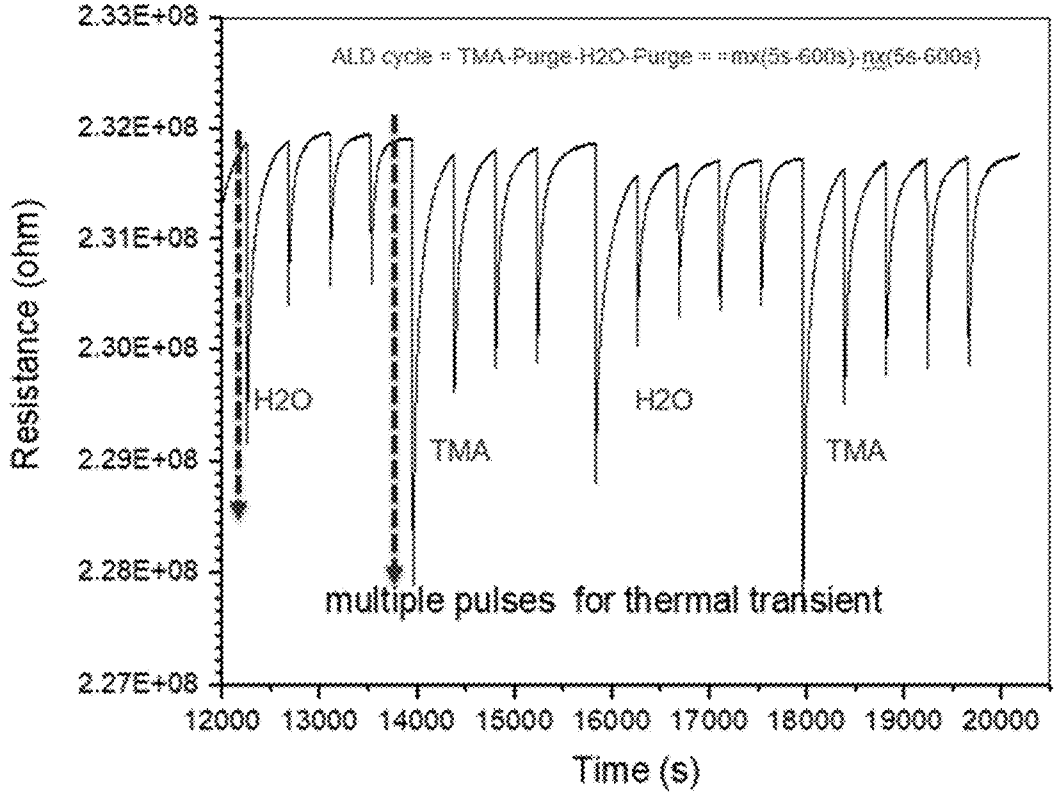
FIGS. 9A-9B are graphs of in-situ resistance changes by precursor dosing during an ALD process deposition of $Al_2O_3$.
Figure 9B:
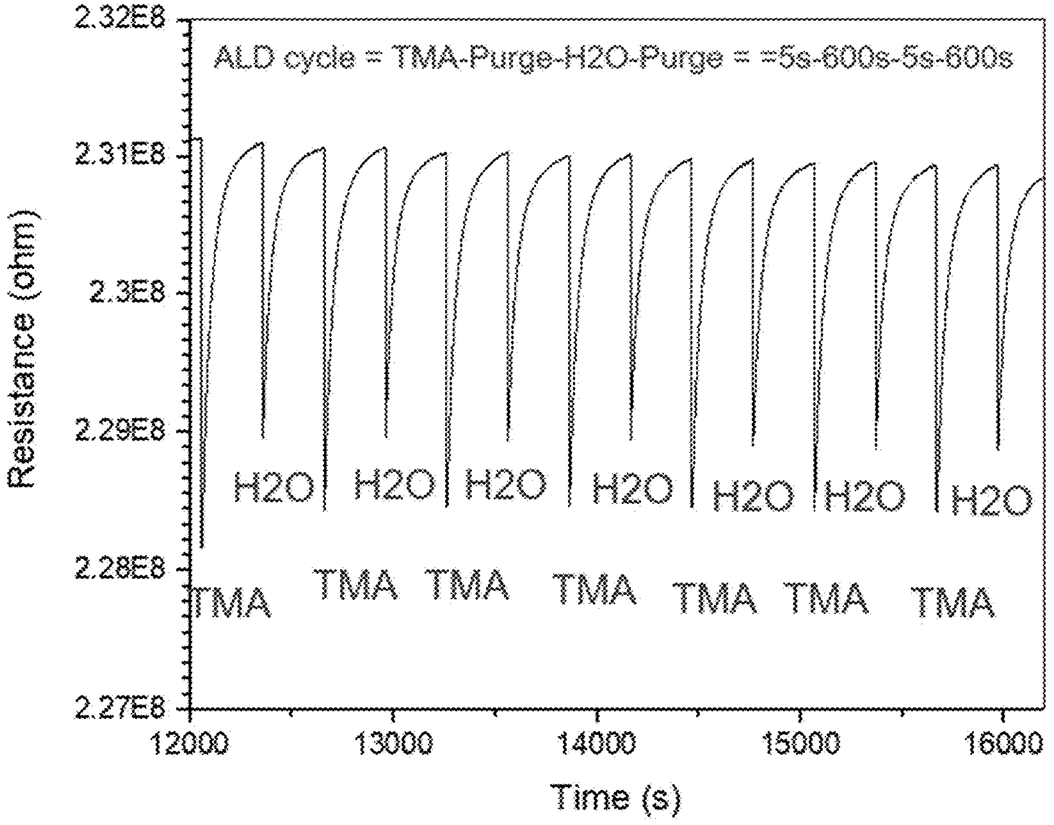

FIG. 9A-9B are graphs of in-situ resistance changes by precursor during an ALD process (deposition of $Al_2O_3$ at ALD temperature of 53° C. and MCP TCR of −0.023). FIGS. 9A-9B highlight that a greater change in resistance occurs at the first precursor dose in a sequence. The decrease in MCP resistance during the precursor exposures corresponds to an increase in the MCP temperature because the TCR has a negative value. The temperature increase is expected for an exothermic reaction such as the $Al_2O_3$ ALD (FIG. 7A). Under the ALD conditions used for the experiment in FIG. 9A, the MCP $Al_2O_3$ growth on the surfaces of the MCP pores saturates after the first TMA and $H_2O$ exposures. However, the resistance is seen to decrease during the second, third and fourth TMA and $H_2O$ exposures during the multi-pulse sequence in FIG. 9A. We attribute this behavior to a slight transient heating of the MCP by the TMA and $H_2O$ vapors due to the steady-state MCP temperature being slightly cooler than that of the precursor vapors. This thermal response is not associated with the enthalpy of the ALD surface reactions. Consequently, the process may account for this resistance change from this thermal response by subtracting from the resistance change observed during the first TMA and $H_2O$ exposures to obtain the resistance change due solely to the enthalpy of the ALD surface reactions. The calorimetry sensors may be equilibrated to the temperatures of the reaction process where they are positioned, such as in the reaction vessel, in the exhaust portion, or in the precursor inlets.

The resistance change from the enthalpy of the ALD surface reactions can be converted to a temperature change, ΔT, using the known TCR value for the MCP calorimeter. Table 1 shows the ΔT values calculated from the resistance changes in FIG. 9A during the exposures to TMA (0.396° C.) and $H_2O$ (0.454° C.) using the TCR value −0.0155. The total temperature change for the $Al_2O_3$ ALD is the sum of these values, 0.850° C. The enthalpy change that produced the temperature rise, ΔT, can be calculated from the heat capacity of the MCP. This assumes that the time scale for thermal conduction out of the MCP is much longer than the time scale for the chemical reaction heating. This assumption can be validated by comparing the calculated enthalpy change to the thermodynamic prediction. The MCP heat capacity is calculated from the geometry of the MCP and the heat capacity of glass as shown in Table 2. From this heat capacity and the temperature rise, the enthalpy released is calculated to be −0.129 cal (Table 2).

TABLE 1

| From IV data | Baseline R (ohm) | R Change due to precursor dose (ohm) | MCP TCR | Calculated MCP Temperature Change, ΔT (° C.) |
|---|---|---|---|---|
| R change due to TMA | 2.319e8 | 2.305e8 | −0.0155 | 0.396 |
| R change due to $H_2O$ | 2.319e8 | 2.303e8 | −0.0155 | 0.454 |
| | | Total: | | 0.850 |

TABLE 2

| Quantity (units) | Symbol/formula | Value |
|---|---|---|
| MCP diameter (cm) | D | 3.300 |
| MCP thickness (cm) | t | 0.120 |
| MCP open area ratio (fraction) | OAR | 0.650 |
| MCP area ($cm^2$) | A_MCP = $\pi$*(D/2)$^2$ | 8.553 |
| glass area ($cm^2$) | A_glass = A_MCP * (1-OAR) | 2.994 |
| glass volume ($cm^3$) | V = A_glass * t | 0.359 |
| glass density (g/$cm^3$) | rho | 2.230 |
| glass mass (g) | m = V * rho | 0.801 |
| glass heat capacity (cal/g/K) | kappa | 0.190 |
| MCP heat capacity (cal/C.) | kappa_MCP = kappa * m | 0.152 |
| measured temperature rise (C.) | ΔT | 0.850 |
| measured enthalpy change (cal) | dH = −kappa_MCP * ΔT | −0.129 |

The predicted enthalpy change for one cycle of $Al_2O_3$ ALD can be calculated from the surface area of the MCP pores, the mass of $Al_2O_3$ deposited per $cm^2$ in one cycle, and the reaction enthalpy from thermodynamics. The mass of $Al_2O_3$ deposited can be obtained from in situ quartz crystal microbalance ("QCM") measurements (see GRONER, et al., "*Low-Temperature $Al_2O_3$Atomic Layer Deposition*," Chemistry of Materials 16(4), pp. 639-645 (2004)) and the reaction enthalpy from HSC Chemistry software. Table 3 shows that the predicted enthalpy change is −0.135 cal in very good agreement with the measured enthalpy change of −0.129 cal in Table 2. This good agreement validates the assumption that the time scale for thermal conduction out of the MCP is much longer than the time scale for the chemical reaction heating. This agreement also demonstrates the capability to measure reaction enthalpy changes using the in situ calorimeter.

TABLE 3

| Quantity (units) | Symbol/formula | Value |
|---|---|---|
| MCP diameter (cm) | D | 3.300 |
| MCP pore diameter (cm) | d | 0.002 |
| MCP thickness (cm) | t | 0.120 |
| MCP bias angle (deg) | alpha | 8 |
| pore length (cm) | L = t/cos(alpha) | 0.121 |
| single pore surface area ($cm^2$) | SA_pore = pi*$(d/2)^2$ * L | 7.61E−04 |
| MCP open area ratio (fraction) | OAR | 0.650 |
| single pore projected area ($cm^2$) | A_pore = pi *$(d/2)^2$ | 3.14E−06 |
| MCP area ($cm^2$) | A_MCP = pi*$(D/2)^2$ | 8.553 |
| number of pores | n = A_MCP * OAR/A_pore | 1.77E+06 |
| all pores surface area ($cm^2$) | SA_total = SA_pore * n | 1.35E+03 |
| $Al_2O_3$ reaction enthalpy (kcal/mol $Al_2O_3$) | H_ $Al_2O_3$ (HSC Chemistry) | −292.47 |
| $Al_2O_3$ areal mass/cycle (g/$cm^2$/cycle) | m (from QCM) | 3.50E−08 |
| $Al_2O_3$ molecular weight (g/mol) | MW | 102 |
| $Al_2O_3$ areal mols (mol/$cm^2$) | mols/cm2 = m/MW | 3.43E−10 |
| $Al_2O_3$ mols/cycle | mols = mols/$cm^2$ * SA_total | 4.62E−07 |
| Predicted enthalpy change (cal) | dH = mols * H_$Al_2O_3$ | −0.135 |

Figure 12A:
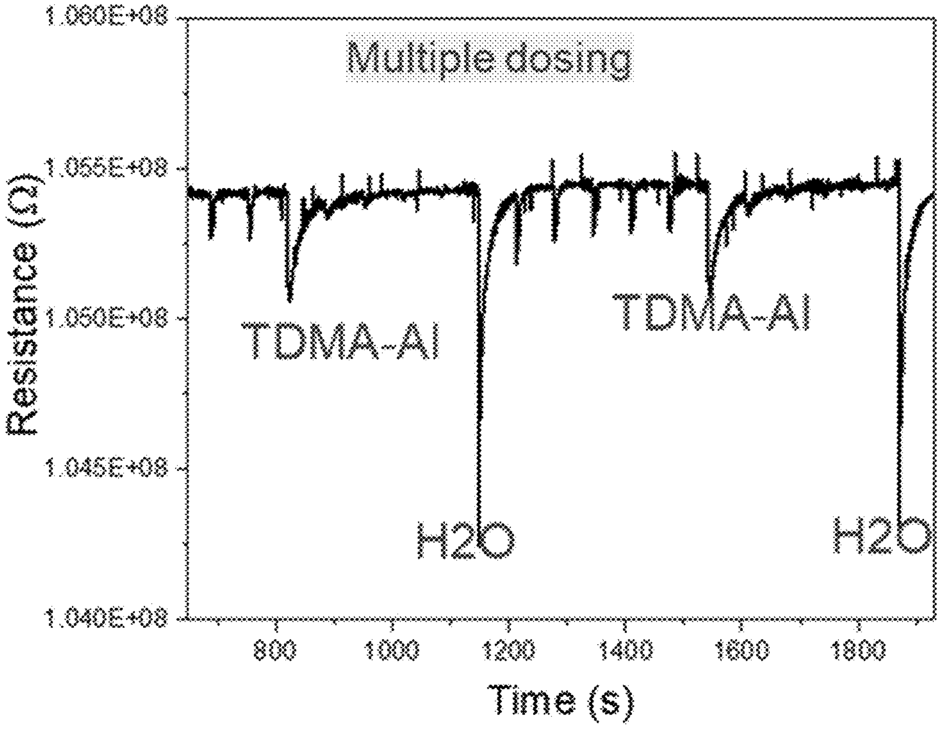
FIGS. 12A-12C are graphs of in-situ resistance changes by precursor during an ALD process deposition of $Al_2O_3$.
Figures 12B, 12C:
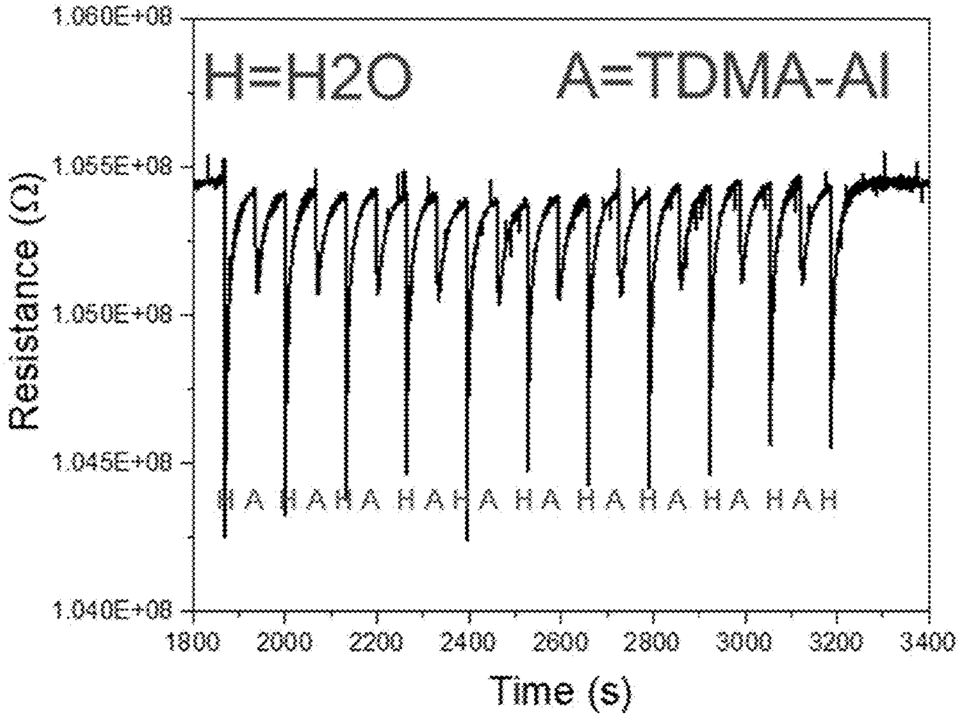

The preceding section described how the enthalpy for an ALD chemical reaction can be calculated from the MCP temperature rise and the thermal and physical properties of the MCP. Alternatively, the MCP calorimeter can be calibrated by measuring the temperature rise produced by an ALD reaction where the enthalpy is known. For instance, FIG. 12C shows that for the TMA and $H_2O$ reactions of $Al_2O_3$ ALD, the measured temperature rises of 0.75° C. and 0.57° C. correspond to reaction enthalpies of −87.74 and −58.49 kcal/mol Al, respectively, as calculated using HSC Chemistry software. These values can then be used to determine the enthalpy for ALD reactions where the thermodynamic parameters are unknown. For instance, during the TDMA-Al and $H_2O$ reactions for $Al_2O_3$ ALD, in situ calorimetry yielded temperature rises of 0.24° C. and 0.76° C. which correspond to reaction enthalpies of −28.52 and −78.33 kcal/mol Al, respectively, based on the calibration using TMA-$H_2O$ (FIG. 12C).

In addition to providing reaction enthalpy values for ALD/ALE surface reactions, the in situ calorimeter can be used to optimize ALD/ALE processes by revealing whether the half-reactions are saturated (FIG. 17, FIG. 18). By monitoring the resistance signals from a 1D or 2D array of calorimetry sensors, the spatial distribution of the ALD growth or ALE removal can be mapped (FIG. 6). These capabilities enable in situ process development and process monitoring of ALD/ALE processes. This information can allow optimization of the precursor utilization and to minimize the nucleation delay for fast ALD/ALE processing.

A calorimetry sensor as described herein may be utilized for process monitoring such as precursors distribution and delivery optimization (e.g., placement to monitory shower head, including shape or position of same such as circle, square, rectangle cylindrical, etc.). Further, calorimetry sensors can be used for flux monitoring from large shower head/plates type depositions systems. Method can help efficient showerhead designed that will not only give better control over process and material uniformity but also reduce cost of precursor by saving precursor. Since this is highly temperature sensitive, a device can be simply used for temperature monitoring of large area.

A calorimetry sensor is a very useful tool for precursor monitoring including gases precursors (e.g., a calorimetry sensor can installed in the individual precursor lines and it will monitor precursor flux by changing resistance and if anything changes in precursor line this calorimetry sensor will keep track of it). For instance, precursor pressure change, contamination, precursor running out any back flow or mixing with other precursors during ALD/ALE processing.

The calorimetry sensor may be positioned such that it need not operate under the same temperatures as the ALD/ALE reaction temperatures.

EXAMPLES

In general, MCPs are thin, 2D porous substrates with a well-defined geometry. For example, a typical 33 mm diameter MCP with 65% open area ratio (ratio of pore cross sectional area to total MCP cross sectional area) and 20 micron pore diameter will have ~1.7 million parallel pores. Conventional etched lead glass or advance ALD resistive layer coated porous glass MCPs are used for many applications. Further based on the applications, these MCP substrates will have a wide range of resistance values (e.g., 1 kohm-10 Gohm). Resistance value of MCPs can be tuned based on the base type of the conducting glass or the ALD coating properties. Due to resistive material property, characteristically resistance of the MCPs will change with respect to temperature. This behavior is normally quantified as the TCR: the slope of the plot of natural log of resistance versus MCP temperature. MCPs typically exhibit semiconductor-like resistive behavior such that the resistance decreases with temperature and the TCR is negative. However, some lower resistance MCPs have shown a near zero or even positive TCR associated with metallic conductivity. Larger TCR values imply a greater change in MCP resistance with respect to temperature. At the micron scale, each single MCP pore will act as a temperature sensitive resistance element with well-defined TCR value and collectively we can measure this change in MCP resistance with respect to temperature and the MCP TCR value can be extracted.

Figure 10:
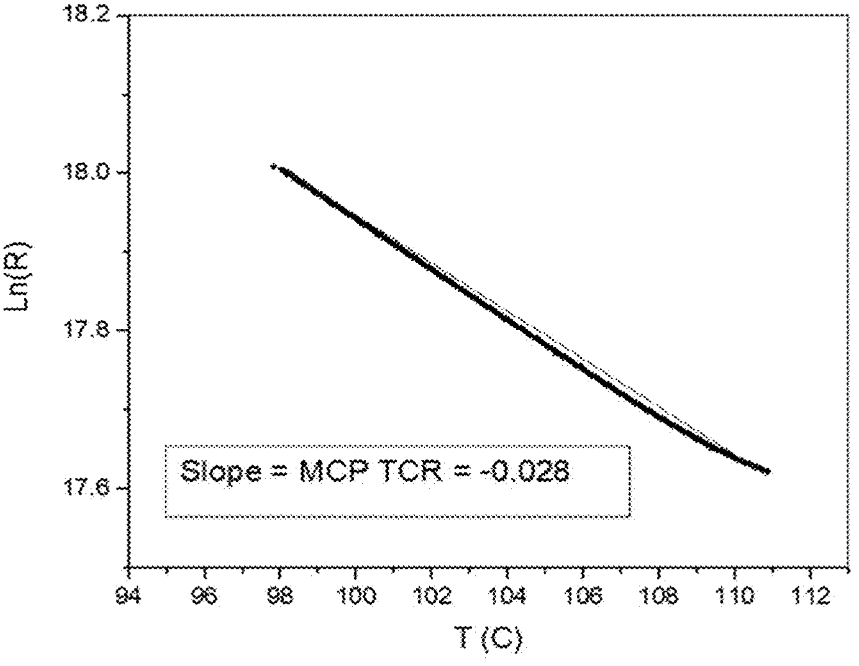
FIG. 10 is a graph of an ALD-MCP having a different composition of nanocomposite coating (compare to FIG. 8) having TCR identified as −0.028.

FIG. 10 is a graph of an ALD-MCP TCR (MCP ID C00104-501 with 20 micron pore size, 60:1 aspect ratio (pore length to pore diameter ratio), 70% open ratio, and ALD growth temperature of 100° C.) where the MCP TCR is identified as −0.031. This MCP was utilized for the ALD experiments further discussed below, with the calculated TCR utilized in the determinations.

Figure 11A:
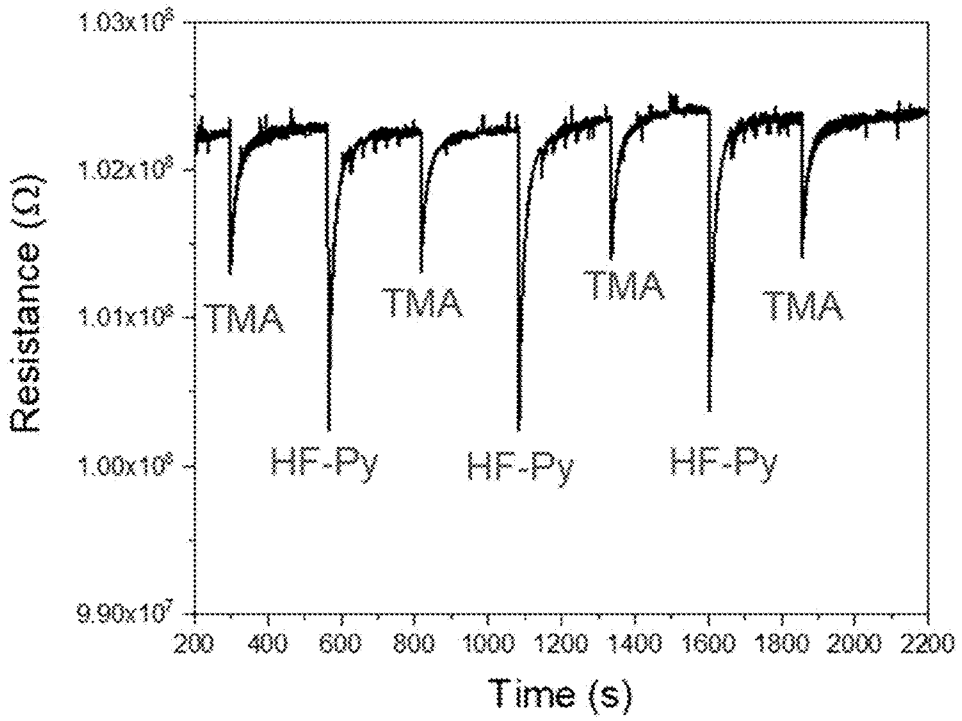
FIGS. 11A-11C are graphs of in-situ resistance changes by precursor during an ALD process deposition of $AlF_3$.
Figure 11B:
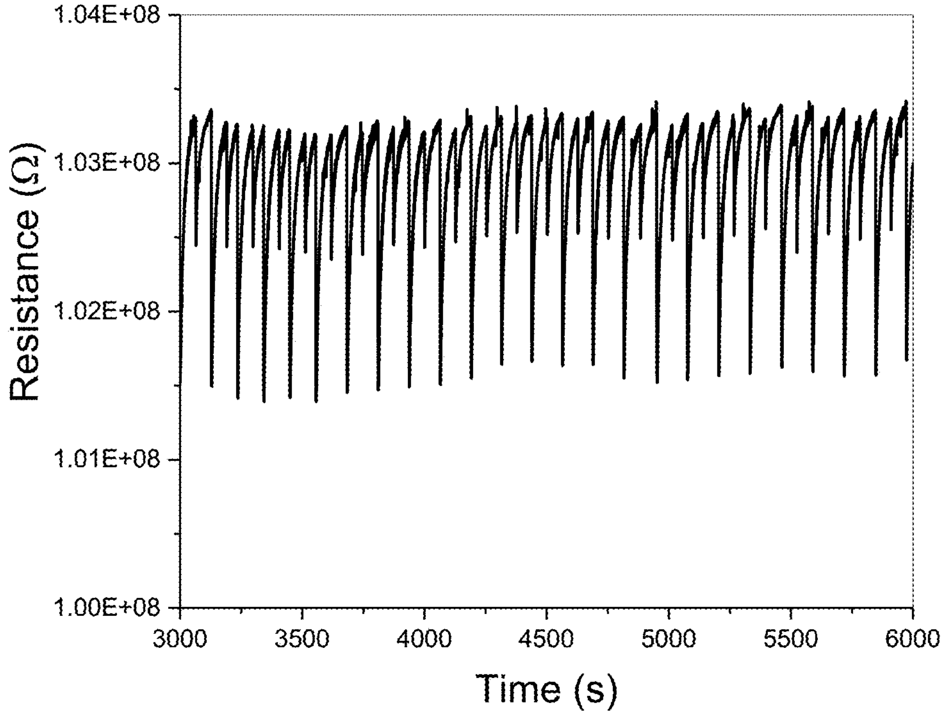
Figure 11C:
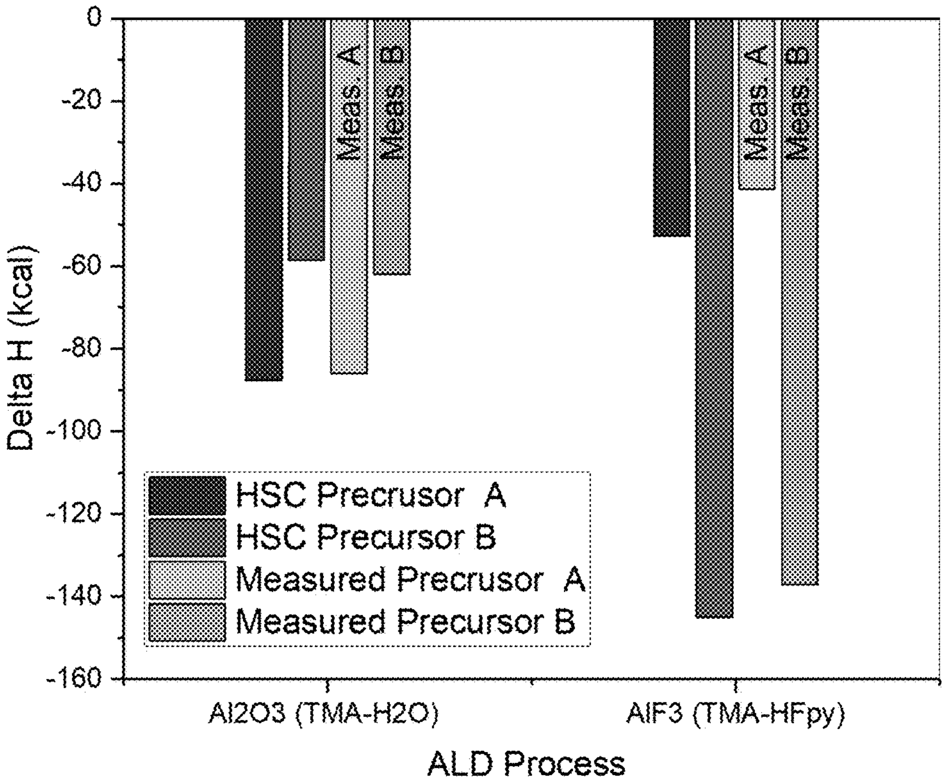

In one embodiment, in-situ ALD calorimetry may be utilized for various ALD processes. FIG. 11A-11B are graphs of in-situ resistance changes by precursor during an ALD process deposition of $AlF_3$. FIG. 11A shows deposition using multiple (5) TMA and multiple (5) HF-Py precursor exposures in sequence. FIG. 11B shows steady state deposition by dosing single pulses of TMA and HF-Py alternately. ALD temperature of 53° C. and MCP TCR of −0.028. FIG. 11C is a reaction heat comparison of calculated and experimentally measured for $Al_2O_3$ and $AlF_3$ ALD processes.

Figure 13A:
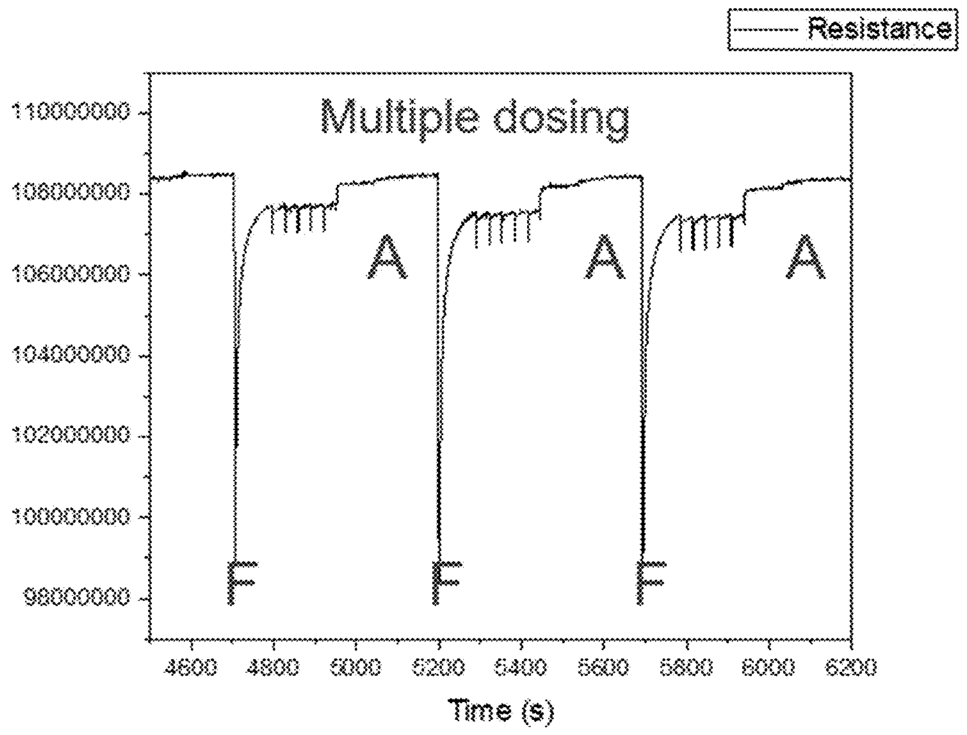
FIGS. 13A-13B are graphs of in-situ resistance changes by precursor during an ALD process deposition of $AlF_3$.
Figure 13B:
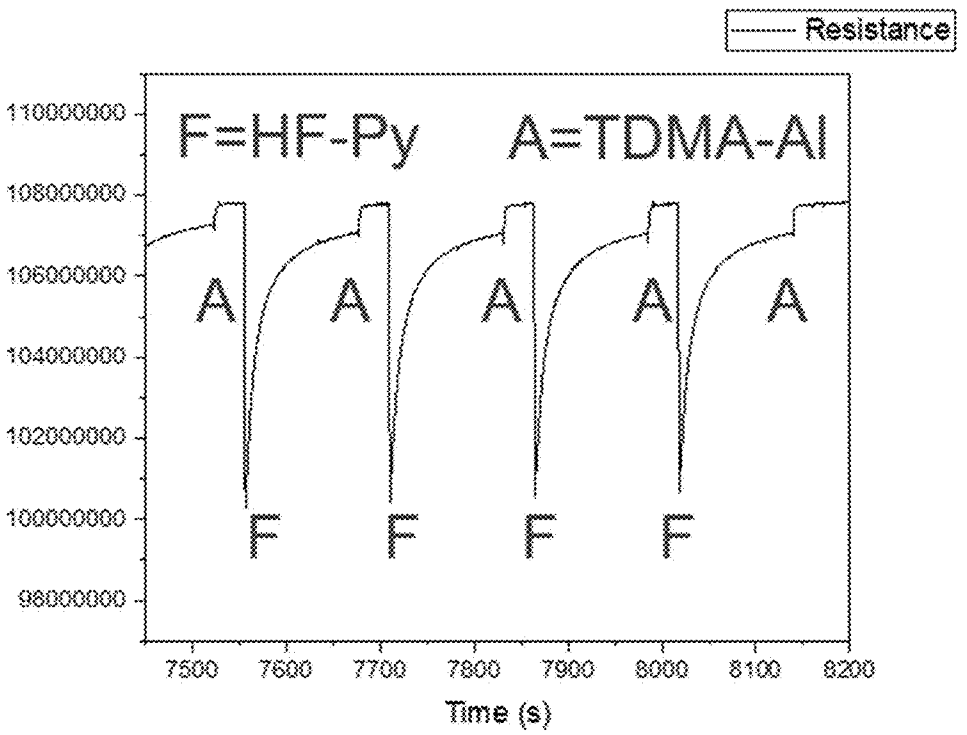

Further experiments, the results of resistance between different deposited resistive coatings was considered. FIG. 12A-12C are graphs of in-situ resistance changes by precursor during an ALD process deposition of $Al_2O_3$. FIG. 12A shows deposition by multiple (5) TDMA-Al precursor pulses and multiple (5) $H_2O$ co-reactant pulses. FIG. 12B shows steady state deposition by dosing single pulses of TDMA-Al and $H_2O$ alternately; ALD temperature of 53° C. and MCP TCR of −0.028. FIG. 12C shows reaction heat comparison of calculated and experimentally measured for $Al_2O_3$ using two different sets of ALD precursors (TMA-$H_2O$) and TDMA-Al—$H_2O$. FIG. 13A-13B are graphs of in-situ resistance changes by precursor during an ALD process deposition of $AlF_3$. FIG. 13A shows deposition by multiple (6) TDMA-Al pulses and multiple (6) HF-py co-reactant pulses. FIG. 13B shows steady state deposition by dosing individual TDMA-Al and Hf-Py pulses alternately.

Figure 14A:
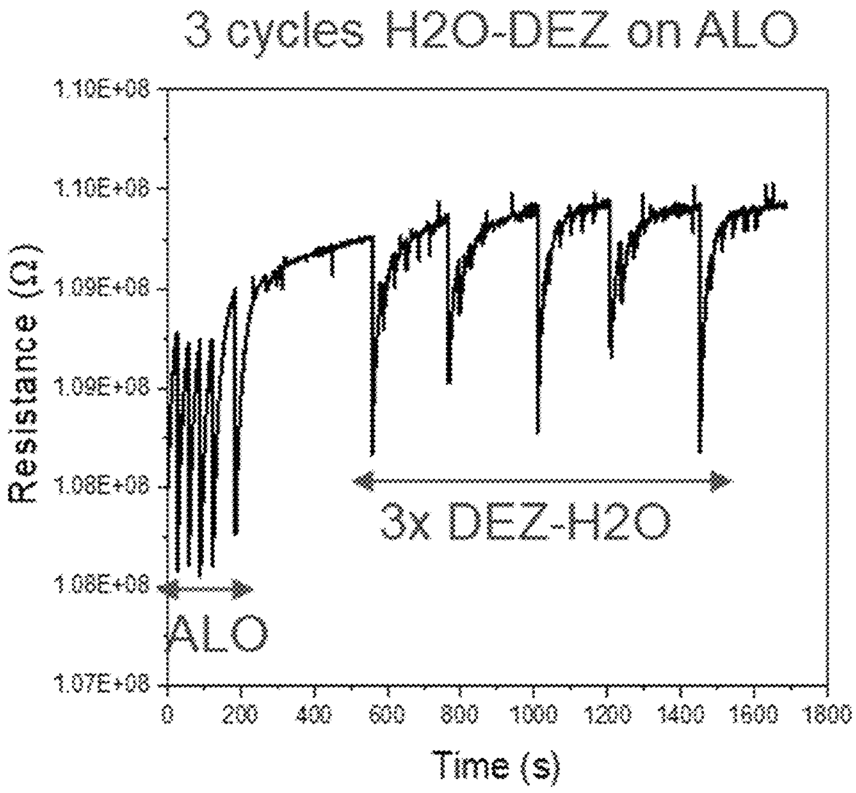
FIGS. 14A-14C are graphs of in-situ resistance during deposition by ALD of ZnO on an MCP with an initial layer of ALO; ALD temperature of 100° C., with FIG. 14A illustrating the initial deposition of ALO followed by ZnO deposition and FIG. 14B illustrating two cycles of diethyl zinc ("DEZ")-$H_2O$ illustrating resistive properties and formation of a sufficiently thick layer of ZnO to become conductive.
Figure 14B:
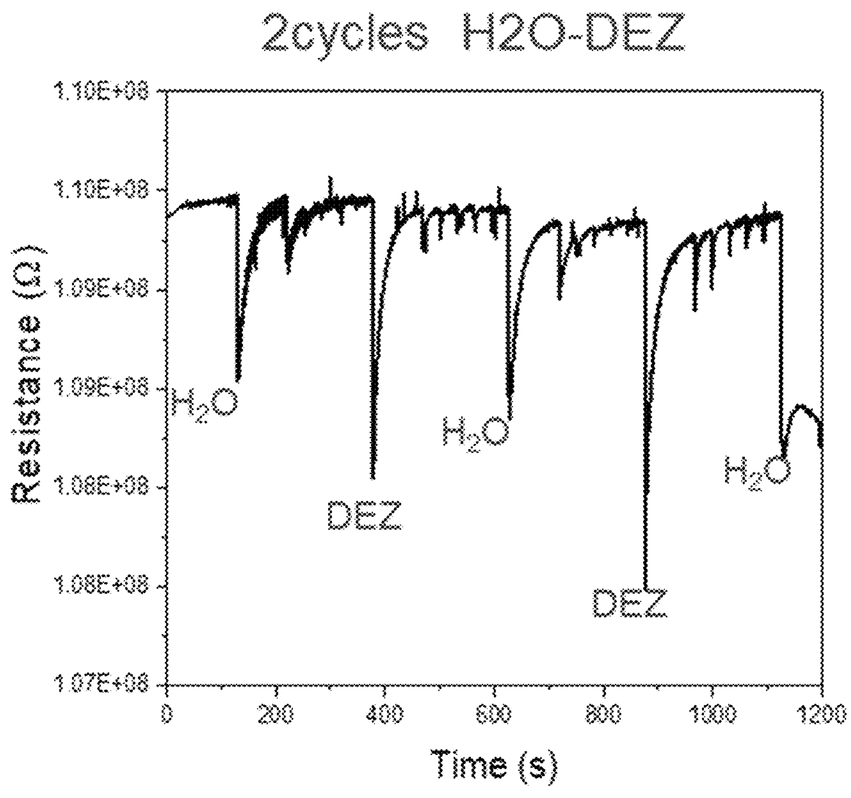
Figure 14C:
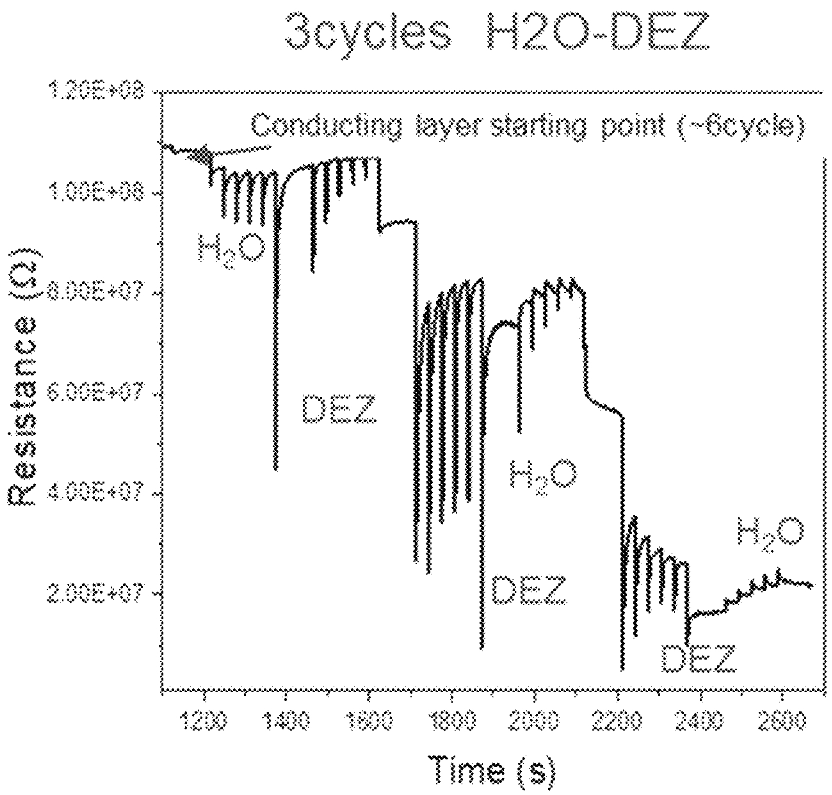

In addition, as previously discussed, the in situ calorimetry measurement utilizes changes in the measured resistance of the substrate to infer the enthalpy of the surface reactions. For this reason, in one embodiment, the ALD layer deposited or the ALE layer removed should be highly resistive, such as an order of magnitude or greater, such that the resistance of this layer is negligible compared to the resistance of the calorimeter. However, the deposited material may change from resistive to conductive under certain circumstances. As the material becomes conductive, the effectiveness of the calorimetry process is reduced because the resistance changes are no longer dependent solely on the temperature. ALD $Al_2O_3$ layers are electrically insulating at all thicknesses. ALD ZnO layers are initially insulating in nature but become electrically conducting when a sufficient thickness is achieved. FIGS. 14A-14C are graphs of in-situ resistance during deposition by ALD of ZnO on an MCP with an initial layer of ALO using different DEZ/$H_2O$ exposures, with FIG. 14A illustrating the initial deposition of ALO followed by ZnO deposition and FIG. 14B illustrating two cycles of DEZ-$H_2O$ illustrating resistive properties and formation of a sufficiently thick layer of ZnO to become conductive. FIG. 14C further illustrates the transition of the ZnO to conductive.

Figure 15A:
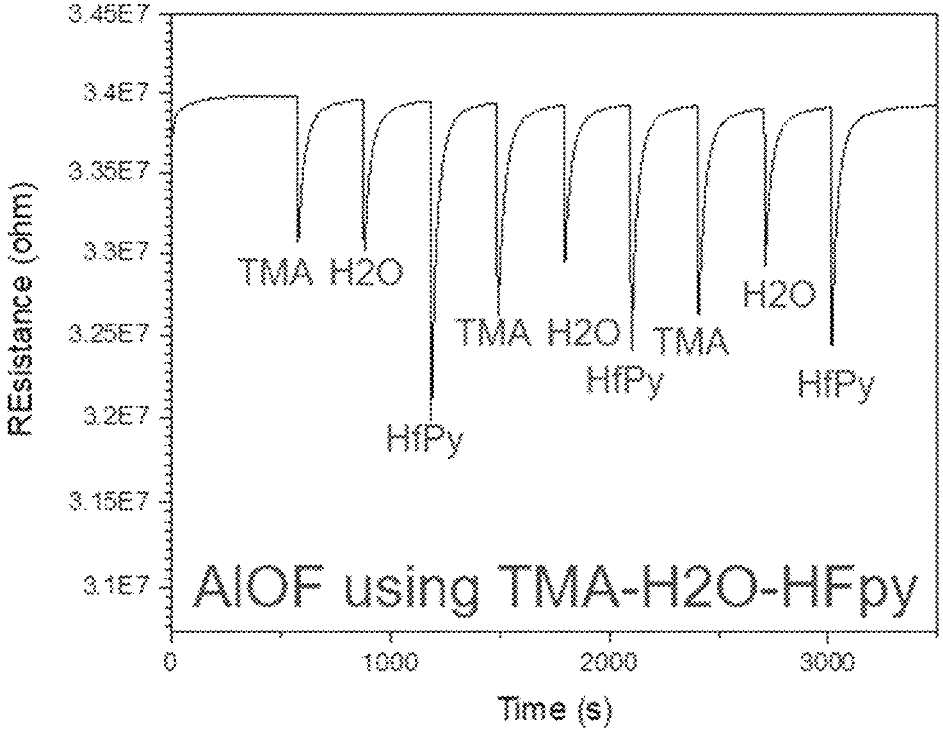
FIG. 15A illustrates resistance in-situ for ALD deposition of a complex material, AlOF made using (TMA-$H_2O$-Hf-Py).
Figure 15B:
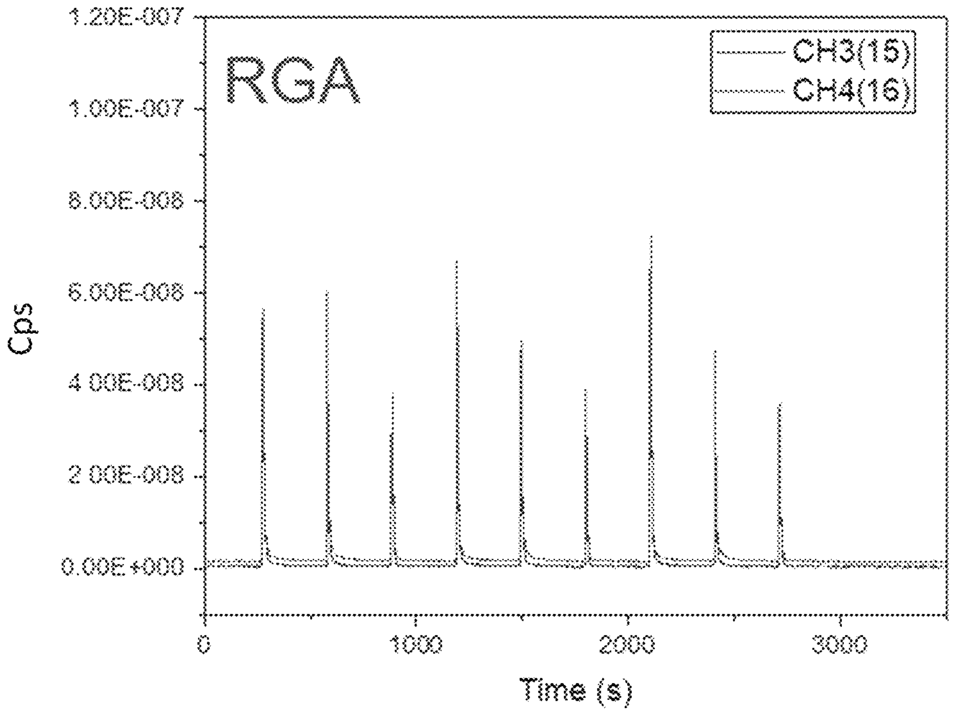
FIG. 15B illustrates residual gas analyzer signals from $CH_3$ and $CH_4$.
Figure 16A:
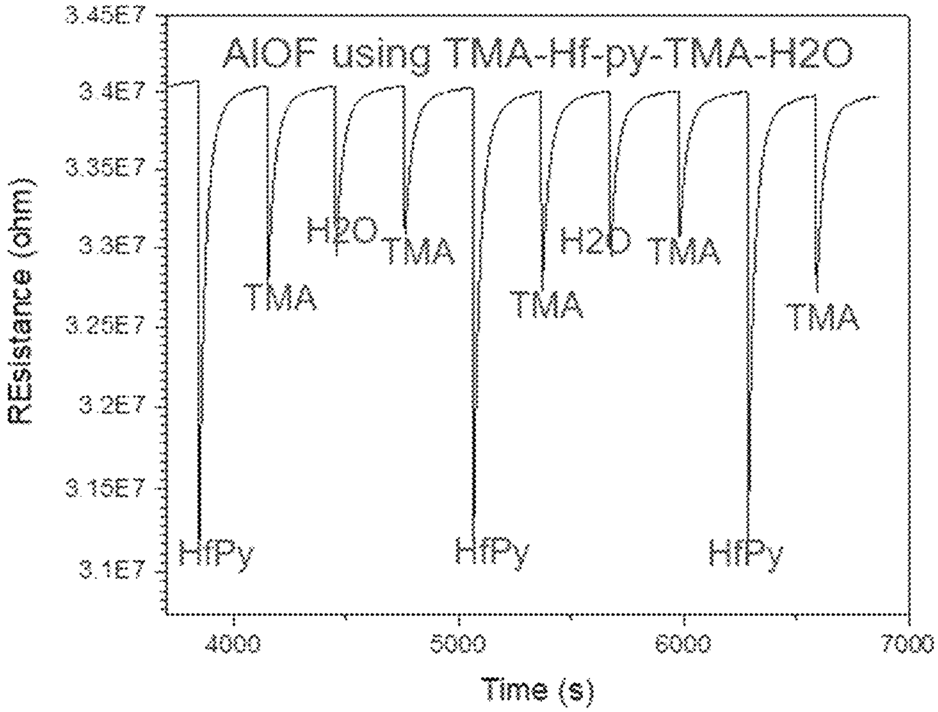
FIG. 16A illustrates resistance in-situ for ALD deposition of a complex material, AlOF made using (TMA-Hf-Py-TMA-$H_2O$).
Figure 16B:
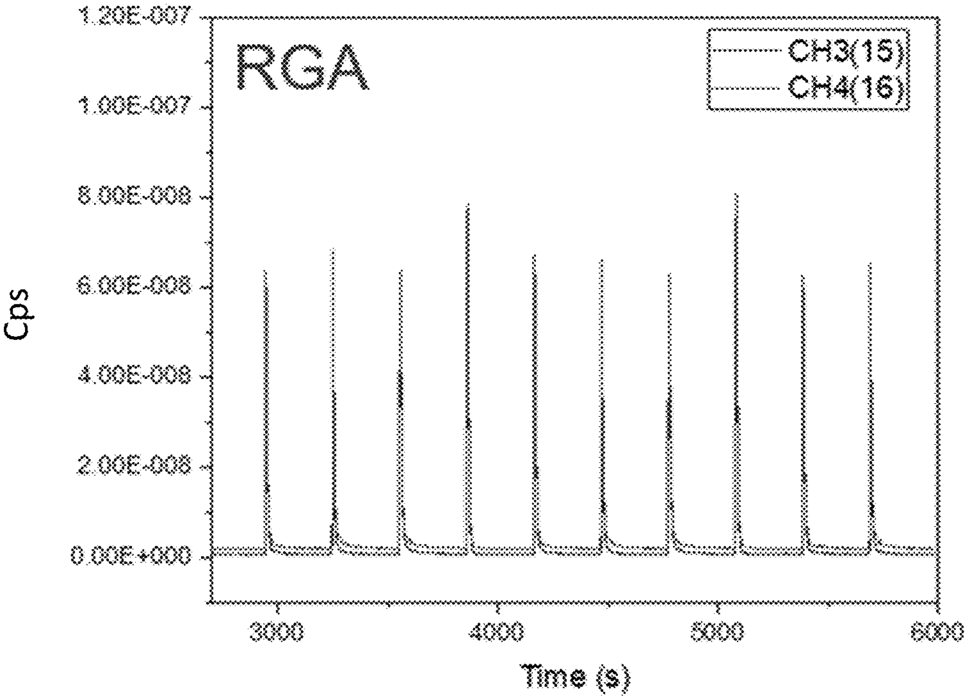
FIG. 16B illustrates residual gas analyzer.

Further, as ALD is a process that is can be utilized for a wide range of depositions, with a range of precursors, including complex materials that may involve the use of several precursors, the deposition of intermediate materials to form a resultant alloy, partial layer depositions of different materials or the use of dopants. FIG. 15A illustrates resistance in-situ for ALD deposition of a complex material, AlOF (TMA-$H_2O$-Hf-Py); FIG. 15B illustrates residual gas analyzer ("RGA") measurements recorded concurrent with the calorimetry measurements of the signals for $CH_3$ (15) and $CH_4$ (16) representative of the $CH_4$ product formed during the ALD surface reactions. FIG. 16A illustrates resistance in-situ for ALD deposition of a complex material, AlOF (TMA-Hf-Py-TMA-$H_2O$); FIG. 16B illustrates the concurrent residual gas analyzer measurements.

Figure 17A:
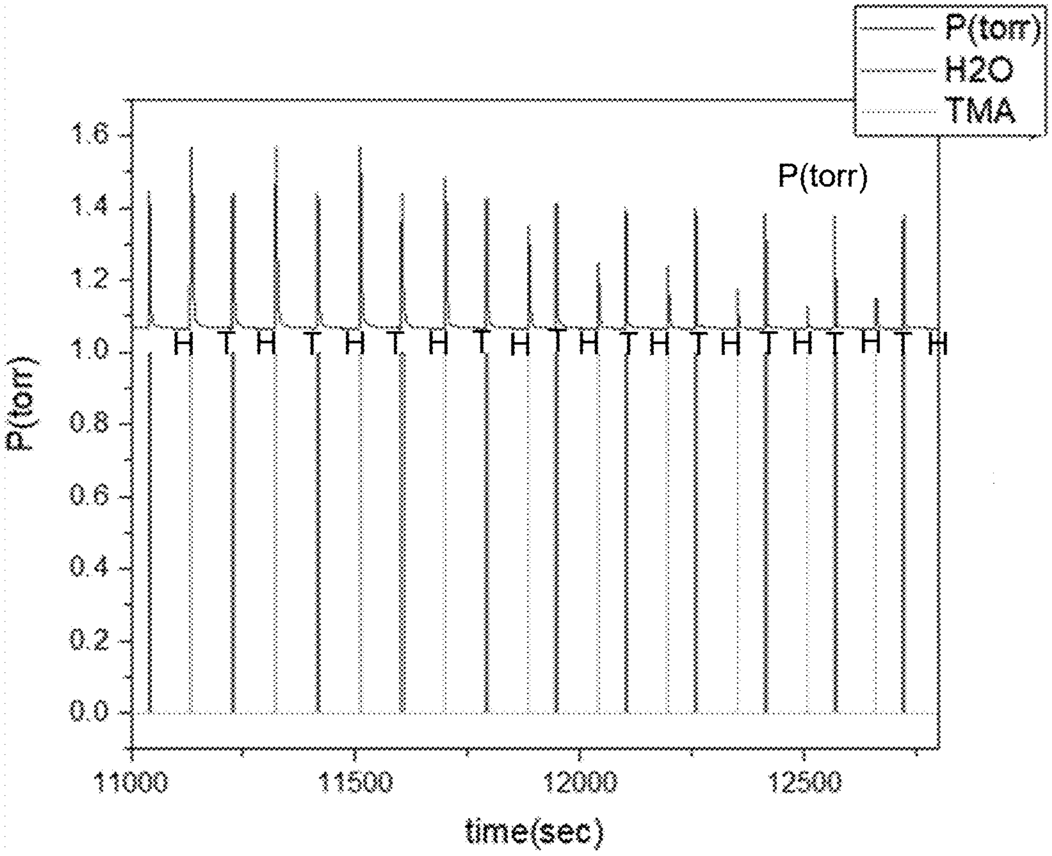
FIGS. 17A-17C illustrate ALD deposition of $Al_2O_3$ with TMA/$H_2O$ precursor where TMA dose time is varied.
Figure 17B:
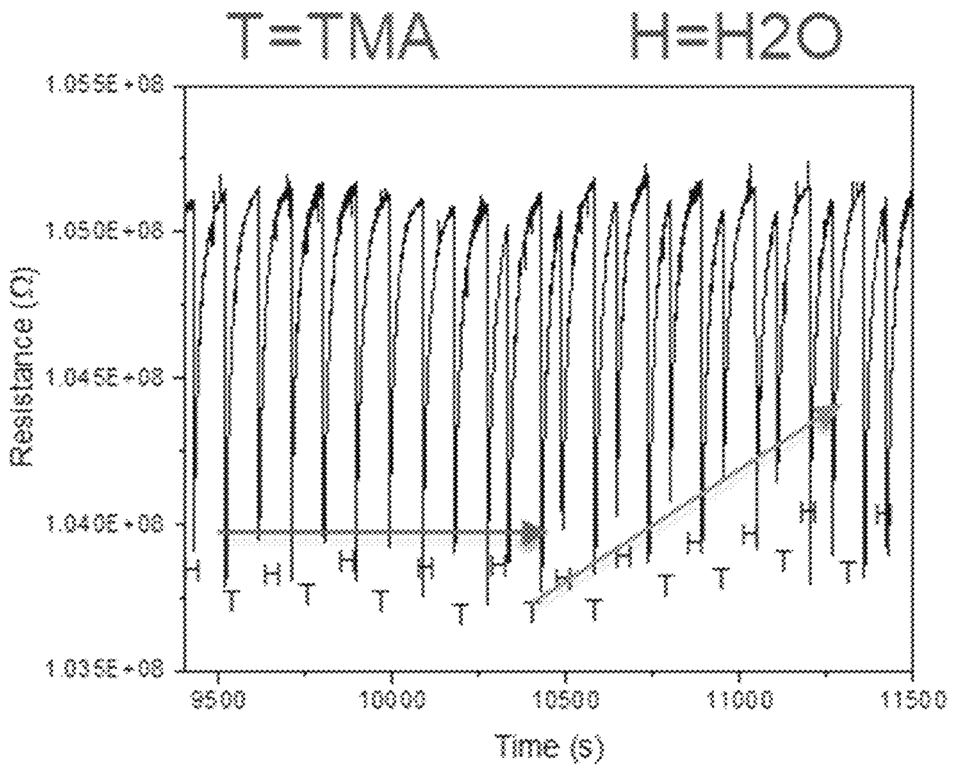
Figure 17C:
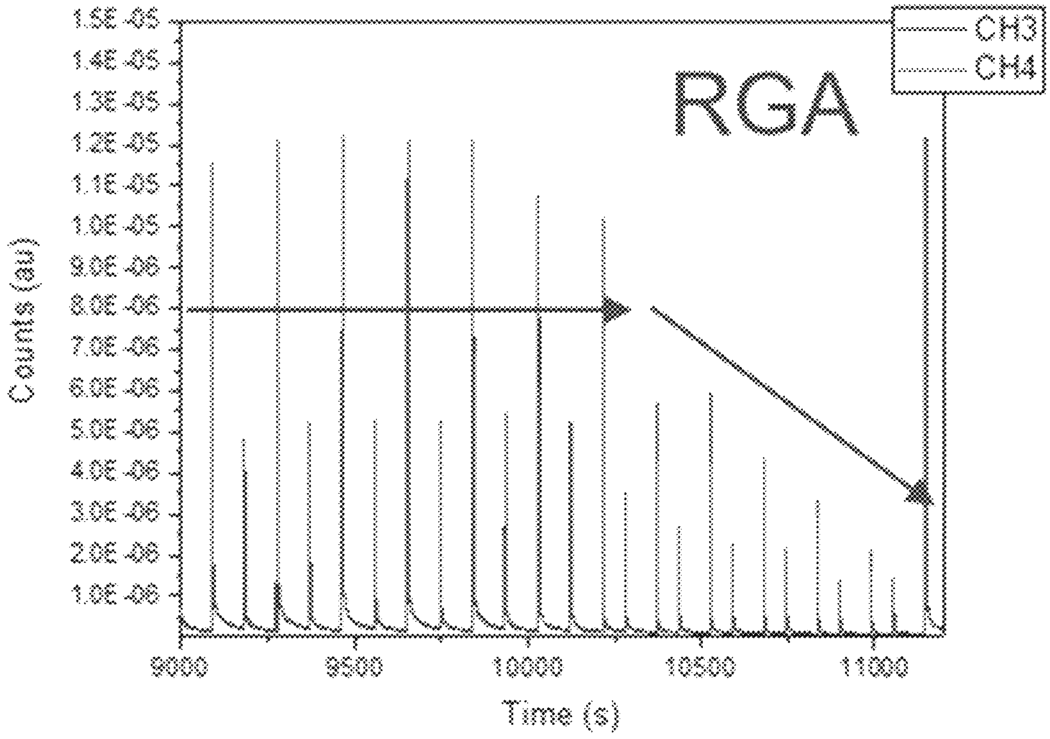
Figure 18A:
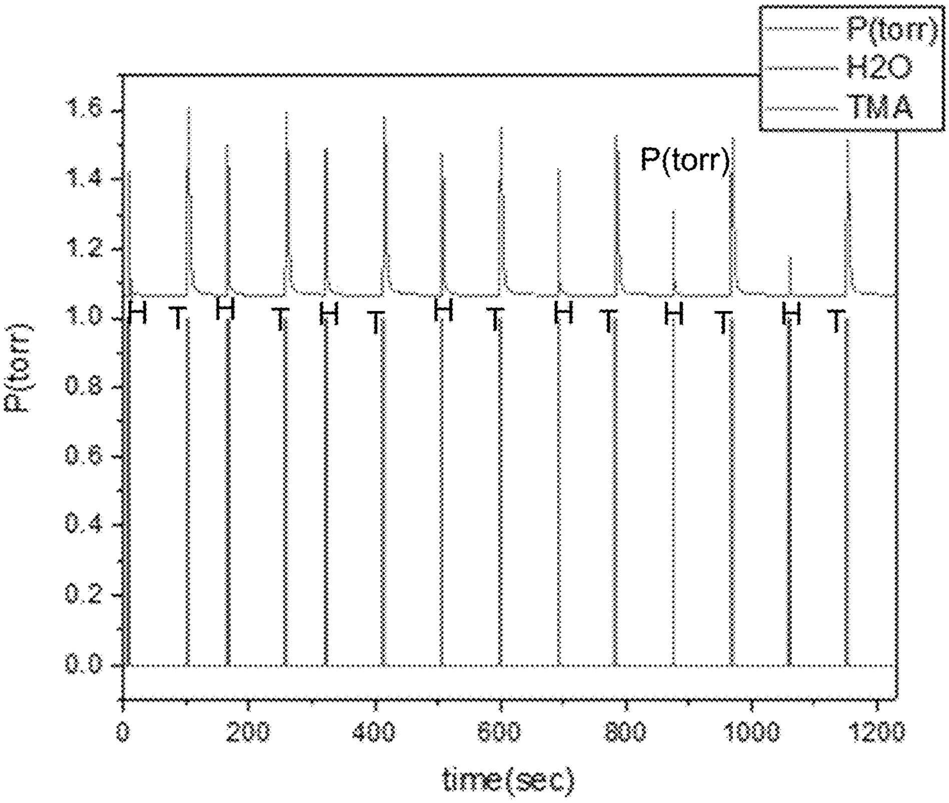
FIGS. 18A-18C illustrate ALD deposition of $Al_2O_3$ with TMA/$H_2O$ precursor where $H_2O$ dose time is varied.
Figure 18B:
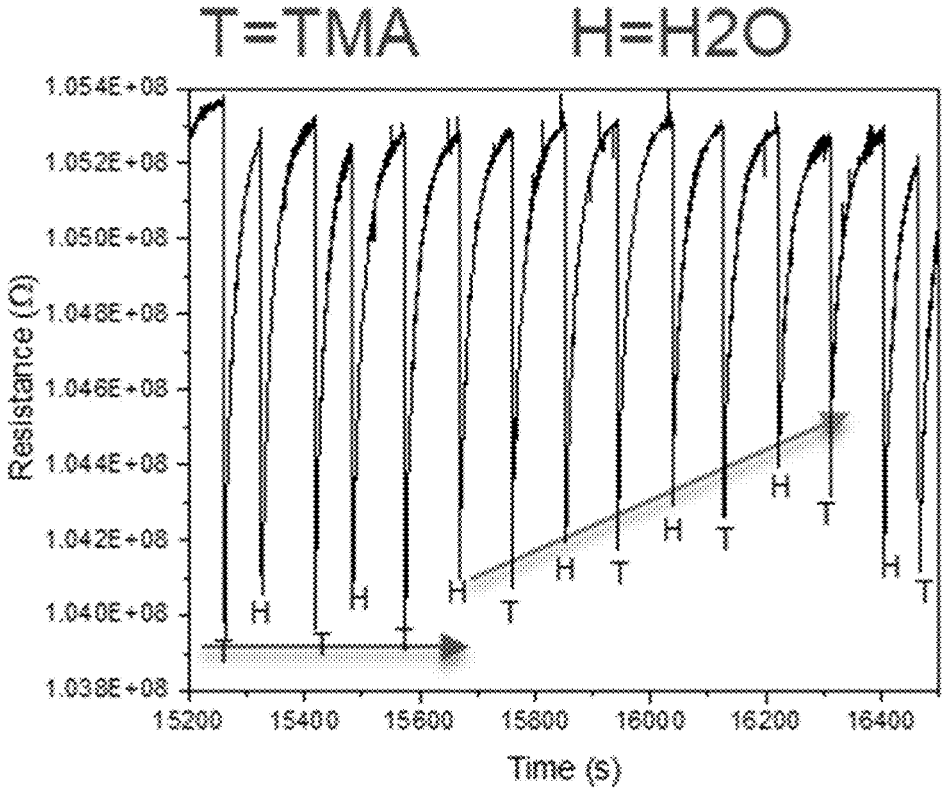
Figure 18C:
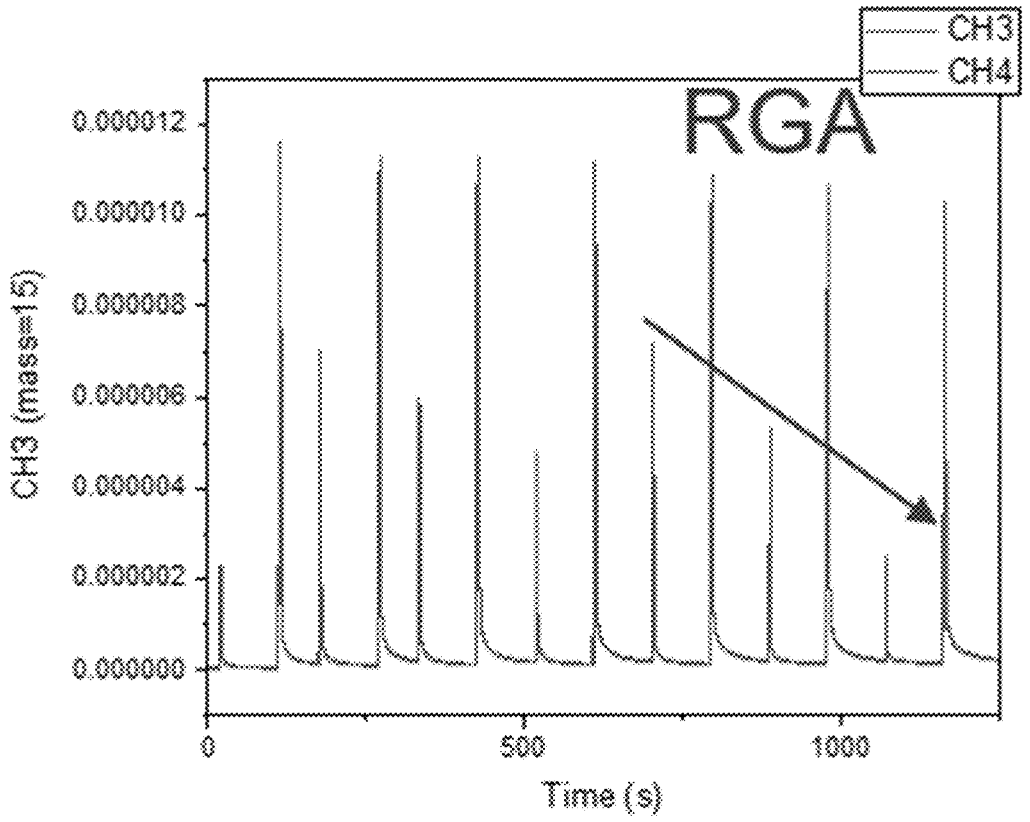

In one experiment, the impact of varying precursor dose time during ALD was varied. FIG. 17A-17C illustrate ALD deposition of $Al_2O_3$ with TMA/$H_2O$ precursor where TMA dose time is varied. FIG. 17A shows dosage pulses for TMA (T) and $H_2O$ (H) and pressure over time. The decreasing amplitude of the TMA pressure pulses at later times in FIG. 17A is a consequence of the shorter TMA exposure times. FIG. 17B illustrates in-situ resistance. FIG. 17C illustrates residual gas analyzer. The lower RGA signals for $CH_4$ at later times in FIG. 17C implies that less $CH_4$ by product is formed during the $Al_2O_3$ ALD using the shorter TMA precursor exposure times because the TMA half-reaction is below the saturation value. Similarly, FIG. 17B shows smaller resistance changes during the TMA and $H_2O$ exposures when the TMA exposure times are below the saturation value. This illustrates that the in situ calorimetry can be used to detect saturation of the TMA surface reaction during $Al_2O_3$ ALD. FIGS. 18A-18C illustrate ALD deposition of $Al_2O_3$ with TMA/$H_2O$ precursor where the $H_2O$ dose time is varied. FIG. 18A shows dosage pulses and pressure over time. FIG. 18B illustrates in-situ resistance. FIG. 18C illustrates the residual gas analyzer measurements. The shorter $H_2O$ dose times used at longer times generate smaller pressure pulses in FIG. 18A, less $CH_4$ byproduct in the RGA measurements of FIG. 18C, and smaller resistance changes in the calorimetry measurements in FIG. 18B. This illustrates that the in situ calorimetry can be used to detect saturation of the $H_2O$ surface reaction during $Al_2O_3$ ALD.

Figure 19:
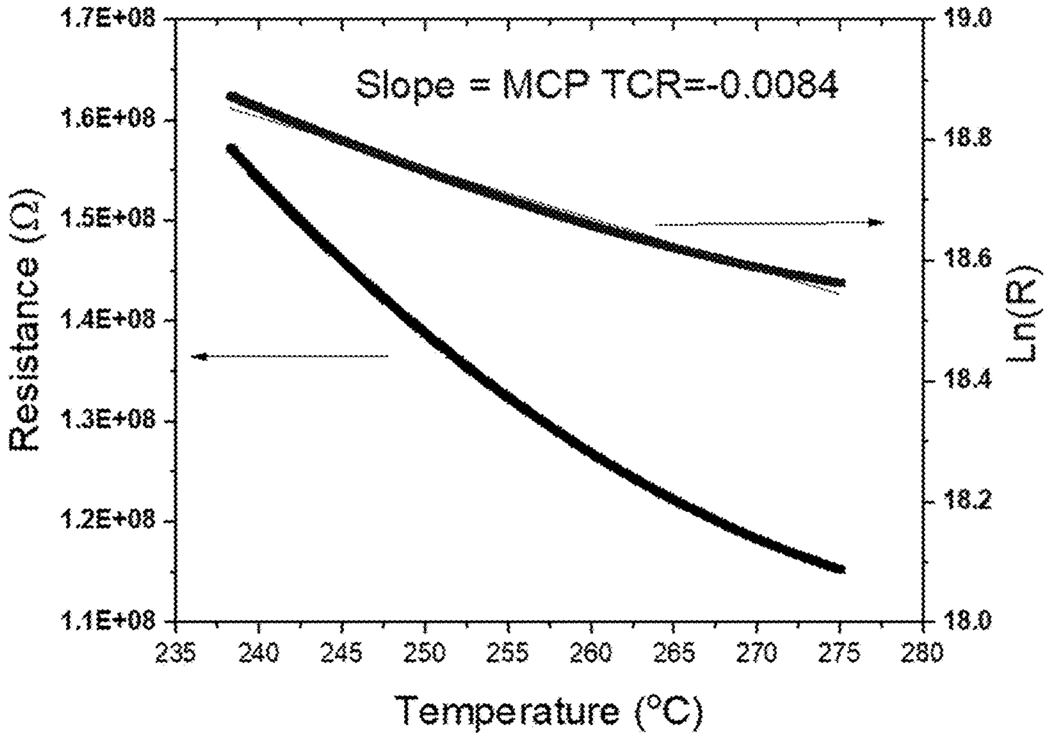
FIG. 19 is a graph of an ALD-MCP made using different composition of nanocomposites aiming different TCR value and TCR identified as −0.0084.
Figure 20A:
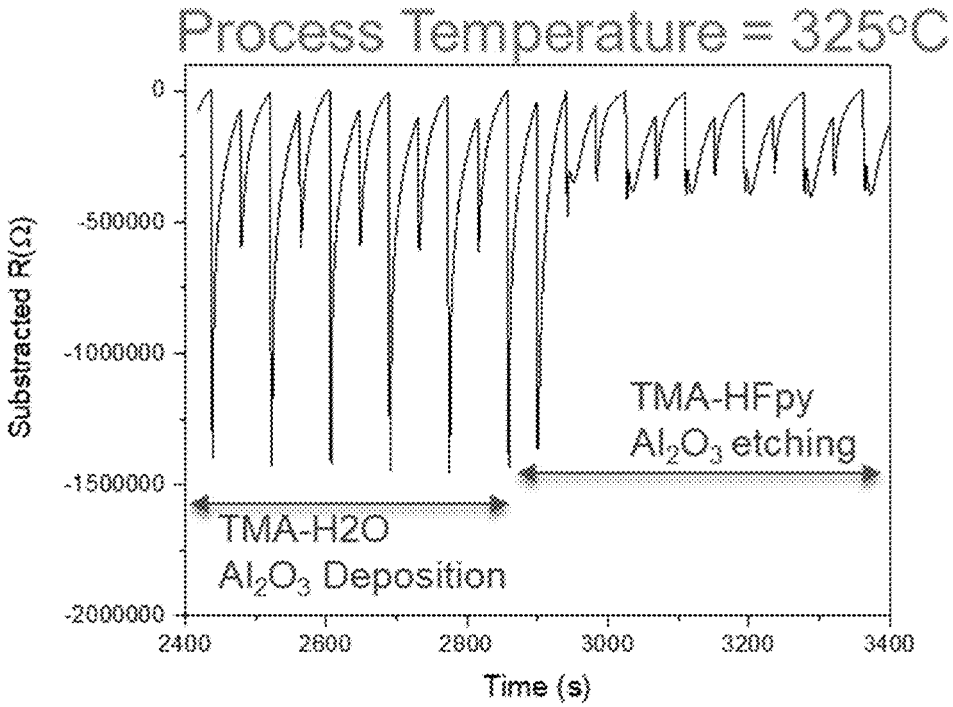
FIG. 20A illustrates resistance in-situ during ALD deposition of first $Al_2O_3$ at 325° C. and ALE of $Al_2O_3$ at 325° C.
Figure 20B:
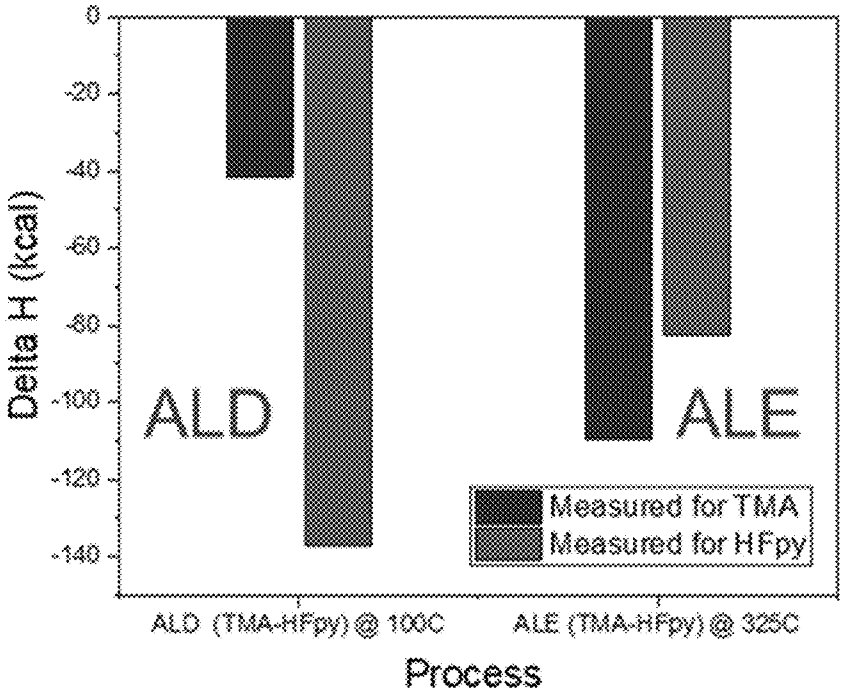
FIG. 20B shows reaction heat experimentally measured for ALD $Al_2O_3$ using TMA-$H_2O$ precursors and ALE of $Al_2O_3$ using TMA-HF-py precursors.

FIG. 19 is a graph of an ALD-MCP TCR identified as −0.0084. Further, in situ calorimetry can be used to measure the enthalpy of surface reactions during ALE processes. FIG. 20A illustrates resistance in-situ for the ALD of $Al_2O_3$ using TMA-$H_2O$ at times between 2400 seconds and ~2850 seconds followed by the ALE of $Al_2O_3$ using TMA-HFpy at times between ~2850 seconds and 3400 seconds. These experiments used a reactor temperature of 325° C. FIG. 20B illustrates the reaction enthalpy values extracted from the in situ resistance measurements for $AlF_3$ ALD using TMA and HFPy at 100° C., and for $Al_2O_3$ ALE using TMA and HfPy at 325° C.

Definitions

As used herein, the singular forms "a," "an," and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

We claim:

1. A calorimetry process comprising:

monitoring the resistance of a calorimetry sensor comprising a resistive porous substrate having a porous substrate and a temperature sensitive resistive conformal coating deposited on the porous substrate, and a resistance circuit that includes the temperature sensitive resistive conformal coating;

measuring a first change in resistance of the resistive porous substrate using the resistance circuit; and determining a change in heat based upon the first change in resistance and a known thermal coefficient of resistance for the resistive porous substrate.

2. The calorimetry process of claim 1, further comprising positioning at least one calorimetry sensor comprising the resistive porous substrate in a reaction vessel.

3. The calorimetry process of claim 2, further wherein the calorimetry sensor is exposed to one of atomic layer deposition reactions, atomic layer etching reactions, or chemical vapor deposition reactions.

4. The calorimetry process of claim 1, wherein determining the first change in resistance comprises determining a resistance and subtracting a baseline resistance.

5. The calorimetry process of claim 4, wherein the change in heat is calculated by multiplying the first change in resistance by the temperature coefficient of resistance for the conformal temperature sensitive resistive coating deposited on the porous substrate.

6. The calorimetry process of claim 5, comprising positioning a least one calorimetry sensor at a showerhead of an ALD/ALE reactor.

* * * * *